(12) United States Patent
Kim et al.

(10) Patent No.: US 12,471,429 B2
(45) Date of Patent: Nov. 11, 2025

(54) TILED DISPLAY DEVICE

(71) Applicant: Samsung Display Co., Ltd., Yongin-si (KR)

(72) Inventors: Hoon Kim, Suwon-si (KR); Eun Je Jang, Hwaseong-si (KR); Jang Bog Ju, Seoul (KR); Chang Hyeok Choi, Asan-si (KR); Yong Sik Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1122 days.

(21) Appl. No.: 17/445,287

(22) Filed: Aug. 17, 2021

(65) Prior Publication Data

US 2022/0085098 A1 Mar. 17, 2022

(30) Foreign Application Priority Data

Sep. 16, 2020 (KR) ........................ 10-2020-0118796

(51) Int. Cl.
*H10H 29/14* (2025.01)
(52) U.S. Cl.
CPC ................................ *H10H 29/142* (2025.01)
(58) Field of Classification Search
CPC .. H10H 29/142; H10H 20/821; H10H 20/857; H01L 25/0753
See application file for complete search history.

(56) References Cited

U.S. PATENT DOCUMENTS

| 5,867,236 | A | * | 2/1999 | Babuka | .................... G09G 3/20 |
| | | | | | 349/190 |
| 2019/0179591 | A1 | * | 6/2019 | Kuo | ....................... H10K 59/18 |
| 2020/0251457 | A1 | * | 8/2020 | Huang | ................ H01L 25/0753 |

FOREIGN PATENT DOCUMENTS

| KR | 10-1895522 B1 | 10/2018 |
| KR | 10-2019-0070633 A | 6/2019 |
| KR | 10-2019-0072196 A | 6/2019 |

* cited by examiner

*Primary Examiner* — Ratisha Mehta
(74) *Attorney, Agent, or Firm* — Womble Bond Dickinson (US) LLP

(57) ABSTRACT

A tiled display device includes a plurality of display devices adjacent to each other, each of the display devices including a plurality of first pixels and a plurality of second pixels, and a boundary area in which at least one side of each of the display devices is adjacent to a side of another display device and a main area other than the boundary area, wherein the first pixels are in the main area, the second pixels are in the boundary area, each of the first pixels and the second pixels includes a plurality of sub pixels, and each of the sub pixels of the second pixels includes a plurality of partial pixels.

20 Claims, 19 Drawing Sheets

SP: SP1, SP2, SP3

SP: SP1, SP2, SP3
PSP: PSP1, PSP2, PSP3, PSP4

TILED DISPLAY DEVICE

CROSS REFERENCE TO RELATED APPLICATION

This application claims priority to and the benefit of Korean Patent Application No. 10-2020-0118796, filed on Sep. 16, 2020, in the Korean Intellectual Property Office, the disclosure of which is incorporated herein in its entirety by reference.

BACKGROUND

1. Field

The present disclosure relates to a tiled display device.

2. Description of the Related Art

As the information society develops, the demand for display devices for displaying images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices. Of the flat panel display devices, a light emitting display device includes a light emitting element that enables each pixel of a display panel to emit light by itself. Thus, the light emitting display device can display an image without a backlight unit that provides light to the display panel.

When a display device is manufactured to have a large size, a defect rate of light emitting elements may increase due to an increase in the number of pixels, and productivity or reliability may be reduced. To solve these problems, a tiled display device may be implemented to provide a large screen by connecting a plurality of relatively small display devices. The tiled display device implemented by aligning a plurality of display devices adjacent to each other may be seen as one large display device.

SUMMARY

Embodiments of the present disclosure provide a tiled display device that can improve the problem of a boundary part of a display device being seen even when a plurality of display devices are misaligned.

According to an embodiment of the disclosure, the tiled display device includes a plurality of display devices adjacent to each other, and each of the display devices including a plurality of first pixels and a plurality of second pixels, and a boundary area in which at least one side of each of the display devices is adjacent to a side of another display device and a main area other than the boundary area, wherein the first pixels are in the main area, the second pixels are in the boundary area, each of the first pixels and the second pixels includes a plurality of sub pixels, and each of the sub pixels of the second pixels includes a plurality of partial pixels.

In an embodiment, the sub pixels in each of the first pixels and the second pixels include a first sub pixel, a second sub pixel, and a third sub pixel that emit light of different colors and are adjacent to each other.

In an embodiment, each of the first sub pixel, the second sub pixel, and the third sub pixel of the second pixels includes the partial pixels that emit light of a same color and are adjacent to each other, and the partial pixels include a first partial pixel and a second partial pixel adjacent in a short-axis direction of the first sub pixel and further include a third partial pixel located at a side of the first partial pixel in a long-axis direction of the first sub pixel and a fourth partial pixel located at an other side of the first partial pixel in the long-axis direction of the first sub pixel.

In an embodiment, a length of each long side of each of the first partial pixel and the second partial pixel is equal to a length of each long side of each sub pixel of each first pixel.

In an embodiment, a distance from a first side of the first partial pixel to a second side of the second partial pixel in the short-axis direction of the first sub pixel is equal to a length of each short side of each sub pixel of each first pixel.

In an embodiment, the third partial pixel and the fourth partial pixel are spaced from each other with the first partial pixel and the second partial pixel interposed therebetween.

In an embodiment, a direction in which long sides of each of the third partial pixel and the fourth partial pixel extend is parallel to a direction in which short sides of the first partial pixel extend.

In an embodiment, lengths of the respective long sides of third partial pixel and the fourth partial pixel are equal to each other and are equal to a length of each short side of each sub pixel of each first pixel.

In an embodiment, a length of each long side of each of the third partial pixel and the fourth partial pixel is equal to a distance from the first side of a first partial pixel to a second side of the second partial pixel in the short-axis direction of the first sub pixel.

In an embodiment, the first partial pixel and the second partial pixel have a same size, and the third partial pixel and the fourth partial pixel have a same size.

In an embodiment, a size of each of the first partial pixel and the second partial pixel is larger than a size of each of the third partial pixel and the fourth partial pixel.

According to an embodiment of the disclosure, the tiled display device includes a first display device and a second display device adjacent each other in a direction, wherein each of the first display device and the second display device includes a first pixel in a main area, and a second pixel in a boundary area located at an edge of the main area and including a plurality of sub pixels, each including a plurality of partial pixels, wherein at least one of the partial pixels of the first display device does not emit light, and at least one of the partial pixels of the second display device does not emit light.

In an embodiment, each of the sub pixels includes a first partial pixel and a second partial pixel adjacent in a short-axis direction of the sub pixel, a third partial pixel located at a side of the first partial pixel in a long-axis direction of the first partial pixel, and a fourth partial pixel located at an other side of the first partial pixel in the long-axis direction of the first partial pixel.

In an embodiment, a side of a first sub pixel of the first display device and a side of a first sub pixel of the second display device are aligned with each other.

In an embodiment, the third partial pixel and the fourth partial pixel of each sub pixel of the second pixel of the first display device do not emit light, and the third partial pixel and the fourth partial pixel of each sub pixel of the second pixel of the second display device do not emit light.

In an embodiment, the first pixel of the first display device emits light, and the first pixel of the second display device emits light.

In an embodiment, a side of a first sub pixel of the first display device and a side of a first sub pixel of the second display device are not aligned with each other.

In an embodiment, each of the sub pixels includes the first sub pixel, a second sub pixel, and a third sub pixel arranged along a direction.

In an embodiment, in the second pixel of the first display device, the first partial pixel, the third partial pixel and the fourth partial pixel of the first sub pixel do not emit light, and the third partial pixel and the fourth partial pixel of each of the second sub pixel and the third sub pixel do not emit light, and, in the second pixel of the second display device, the third partial pixel and the fourth partial pixel of each of the first sub pixel and the second sub pixel do not emit light, and the second partial pixel, the third partial pixel and the fourth partial pixel of the third sub pixel do not emit light.

In an embodiment, the third partial pixel of each sub pixel of the second pixel of the first display device does not emit light, and the fourth partial pixel of each sub pixel of the second pixel does not emit light.

However, aspects of the embodiments of the present disclosure are not restricted to the one set forth herein. The above and other aspects of the embodiments of the present disclosure will become more apparent to one of ordinary skill in the art to which the present disclosure pertains by referencing the detailed description of the present disclosure given below.

BRIEF DESCRIPTION OF THE DRAWINGS

These and/or other aspects of the embodiments of the present disclosure will become apparent and more readily appreciated from the following description of the embodiments, taken in conjunction with the accompanying drawings in which.

DETAILED DESCRIPTION

Figure 1:
FIG. 1 is a plan view of a tiled display device according to an embodiment.

The present disclosure will now be described more fully hereinafter with reference to the accompanying drawings, in which embodiments of the disclosure are shown. The present disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. It will be understood that when an element or layer is referred to as being "connected to", "coupled to", or "adjacent to" another element or layer, it may be directly connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described with reference to the appended drawings.

FIG. 1 is a plan view of a tiled display device TD according to an embodiment.

Referring to FIG. 1, the tiled display device TD may include a plurality of display devices 10. The display devices 10 may be arranged in a lattice shape, but the present disclosure is not limited thereto. The display devices 10 may be connected to each other in a first direction (X-axis direction) or a second direction (Y-axis direction), and the tiled display device TD may have a specific shape. For example, the display devices 10 may have the same size, but the present disclosure is not limited thereto. For another example, the display devices 10 may have different sizes.

Each of the display devices 10 may be shaped like a rectangle including long sides and short sides. The long sides or short sides of the display devices 10 may be connected to each other. Some of the display devices 10 may be disposed at an edge of the tiled display device TD to form a side of the tiled display device TD. Some other ones of the display devices 10 may be disposed at corners of the tiled display device TD and may form two adjacent sides of the tiled display device TD. Some other ones of the display devices 10 may be disposed inside (e.g., at a central region of) the tiled display device TD and surrounded by other display devices 10.

Each of the display devices 10 may include a display area DA and a non-display area NDA. The display area DA may include a plurality of pixels to display an image. The non-display area NDA may be disposed around the display area DA to surround the display area DA and may not display an image. For example, the non-display area NDA may be disposed around the display area DA to surround the display area DA along the edge or periphery of the display area DA.

The overall shape of the tiled display device TD may be a planar shape, but the present disclosure is not limited thereto. The tiled display device TD may also have a three-dimensional (3D) shape to provide a 3D effect to a user. For example, when the tiled display device TD has a 3D shape, at least some of the display devices 10 may have a curved shape. For another example, the display devices 10 may each have a planar shape but may be connected to each other at an angle (e.g., a set or predetermined angle) so that the tiled display device TD can have a 3D shape.

The tiled display device TD may be formed by connecting the respective non-display areas NDA of adjacent display devices 10. The display devices 10 may be connected to each other through a coupling member or an adhesive member. Therefore, the non-display area NDA between the display devices 10 may be surrounded by adjacent display areas DA. A distance between the respective display areas DA of the display devices 10 may be small enough to make the non-display area NDA between the adjacent display devices 10 or a boundary part between the adjacent display devices 10 substantially unrecognizable by a user. In some embodiments, external light reflectance of the display area DA of each of the display devices 10 and external light reflectance of the non-display area NDA between the adjacent display devices 10 may be substantially equal. Therefore, the tiled display device TD may substantially eliminate a sense of separation between the display devices 10 and improve the degree of immersion in images by preventing the non-display area NDA or the boundary part between the display devices 10 from being recognized.

Figure 2:
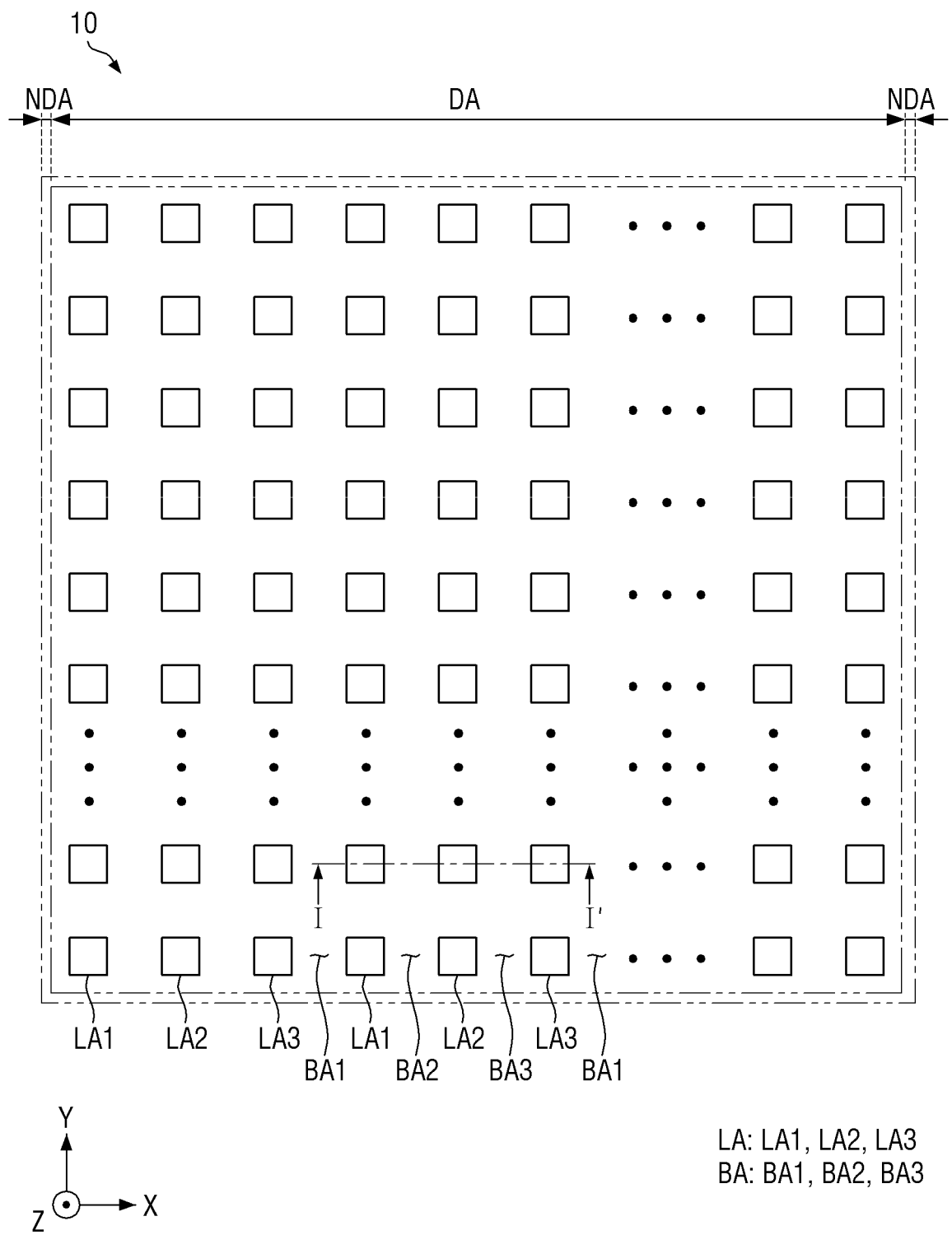
FIG. 2 is a plan view of a display device according to an embodiment.

FIG. 2 is a plan view of a display device 10 according to an embodiment.

Referring to FIG. 2, the display device 10 may include a plurality of pixels arranged along a plurality of rows and a plurality of columns in the display area DA. Each of the pixels may include a light emitting area LA defined by a pixel defining layer and may emit light having a peak wavelength (e.g., a set or predetermined peak wavelength) through the light emitting area LA. For example, the display area DA of the display device 10 may include first to third light emitting areas LA1, LA2, and LA3. Each of the first to third light emitting areas LA1, LA2, and LA3 may be an area where light generated by a light emitting element of the display device 10 is emitted to the outside of the display device 10.

Each of the first to third light emitting areas LA1, LA2, and LA3 may emit light having a peak wavelength (e.g., a set or predetermined peak wavelength) to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength of 610 to 650 nm, the light of the second color may be green light having a peak wavelength of 510 to 550 nm, and the light of the third color may be blue light having a peak wavelength of 440 to 480 nm. However, the present disclosure is not limited thereto.

The first to third light emitting areas LA1, LA2, and LA3 may be sequentially and repeatedly arranged along the first direction (X-axis direction) of the display area DA. For example, a width of the first light emitting area LA1 in the first direction (X-axis direction) may be greater than a width of the second light emitting area LA2 in the first direction, and the width of the second light emitting area LA2 in the first direction may be greater than a width of the third light emitting area LA3 in the first direction. For another example, the width of the first light emitting area LA1 in the first direction (X-axis direction), the width of the second light emitting area LA2 in the first direction, and the width of the third light emitting area LA3 in the first direction may be substantially equal.

For example, the area of the first light emitting area LA1 may be larger than the area of the second light emitting area LA2, and the area of the second light emitting area LA2 may be larger than the area of the third light emitting area LA3. For another example, the area of the first light emitting area LA1, the area of the second light emitting area LA2, and the area of the third light emitting area LA3 may be substantially equal.

The display area DA of the display device 10 may include a plurality of light blocking areas BA surrounding the light emitting areas LA. For example, the display area DA may include first to third light blocking areas BA1, BA2, and BA3. The first to third light blocking areas BA1, BA2, and BA3 may be disposed on respective sides of the first to third light emitting areas LA1, LA2, and LA3, respectively, and may prevent color mixing of light emitted from the first to third light emitting areas LA1, LA2, and LA3.

Figure 3:
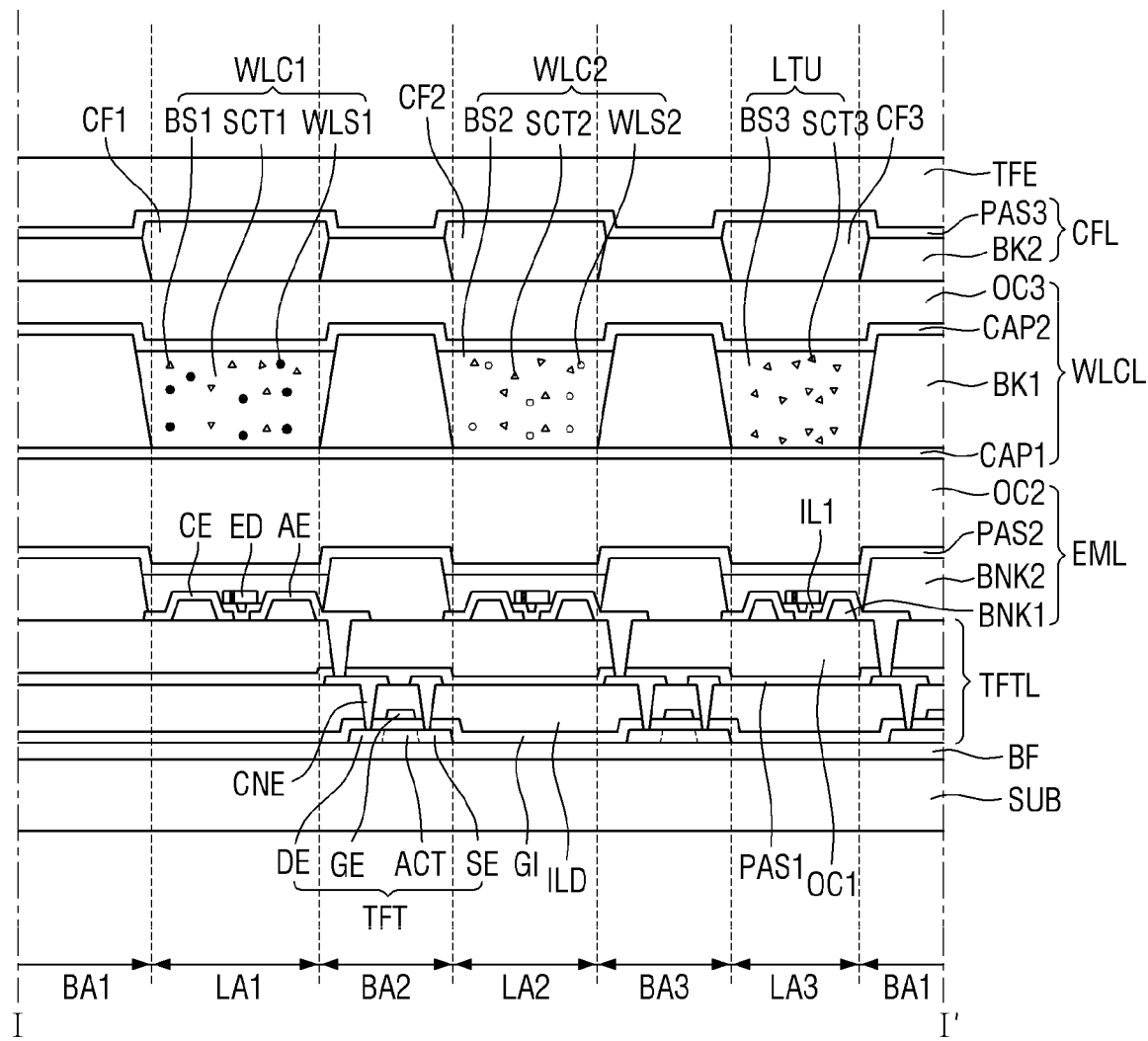
FIG. 3 is a cross-sectional view taken along the line I-I' of FIG. 2.

FIG. 3 is a cross-sectional view taken along the line I-I' of FIG. 2.

Referring to FIG. 3, the display area DA of the display device 10 may include the first to third light emitting areas LA1, LA2, and LA3. Each of the first to third light emitting areas LA1, LA2, and LA3 may be an area where light generated by a light emitting diode ED of the display device 10 is emitted to the outside of the display device 10.

The display device 10 may include a substrate SUB, a buffer layer BF, a thin-film transistor layer TFTL, a light emitting element layer EML, a wavelength conversion layer WLCL, a color filter layer CFL, and an encapsulation layer TFE.

The substrate SUB may be a base substrate or a base member and may be made of an insulating material such as polymer resin. For example, the substrate SUB may be a flexible substrate that can be bent, folded, rolled, etc. The substrate SUB may include, but is not limited to, polyimide (PI).

The buffer layer BF may be disposed on the substrate SUB. The buffer layer BF may be an inorganic layer that can prevent (or reduce) penetration of air or moisture. For example, the buffer layer BF may include a plurality of inorganic layers stacked alternately.

The thin-film transistor layer TFTL may include thin-film transistors TFT, a gate insulating layer GI, an interlayer insulating layer ILD, connection electrodes CNE, a first passivation layer PAS1, and a first planarization layer OC1.

The thin-film transistors TFT may be disposed on the buffer layer BF and may form respective pixel circuits of a plurality of pixels. For example, the thin-film transistors TFT may be driving transistors or switching transistors of the pixel circuits. Each of the thin-film transistors TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may be overlapped by the gate electrode GE in a thickness direction of the substrate SUB, and insulated from the gate electrode GE by the gate insulating layer GI. The source electrode SE and the drain electrode DE may be formed by making the material of the semiconductor region ACT conductive.

The gate electrode GE may be disposed on the gate insulating layer GI. The gate electrode GE may overlap the semiconductor region ACT with the gate insulating layer GI interposed between them.

The gate insulating layer GI may be provided on the semiconductor regions ACT, the source electrodes SE, and the drain electrodes DE. For example, the gate insulating layer GI may cover the semiconductor regions ACT, the source electrodes SE, the drain electrodes DE and the buffer layer BF and insulate the semiconductor regions ACT from the gate electrodes GE. The gate insulating layer GI may include contact holes through which the connection electrodes CNE pass.

The interlayer insulating layer ILD may be disposed on the gate electrodes GE. For example, the interlayer insulating layer ILD may include contact holes through which the connection electrodes CNE pass. Here, the contact holes of the interlayer insulating layer ILD may be connected to the contact holes of the gate insulating layer GI.

The connection electrodes CNE may be disposed on the interlayer insulating layer ILD. Some of the connection electrodes CNE may connect the drain electrodes DE of the thin-film transistors TFT and first electrodes AE of light emitting elements EL. These connection electrodes CNE may contact the drain electrodes DE through the contact holes provided in the gate insulating layer GI and the interlayer insulating layer ILD. Some of the connection electrodes CNE may contact the source electrodes SE through the contact holes provided in the gate insulating layer GI and the interlayer insulating layer ILD.

The first passivation layer PAS1 may be provided on the connection electrodes CNE to protect the thin-film transistors TFT. For example, the first passivation layer PAS1 may include contact holes through which the first electrodes AE of the light emitting elements EL pass.

The first planarization layer OC1 may be provided on the first passivation layer PAS1 to planarize the top of the thin-film transistor layer TFTL. For example, the first planarization layer OC1 may include contact holes through which the first electrodes AE of the light emitting elements EL pass. Here, the contact holes of the first planarization layer OC1 may be connected to the contact holes of the first passivation layer PAS1.

The light emitting element layer EML may include the light emitting elements EL, a first insulating layer IL1, first banks BNK1, second banks BNK2, a second passivation layer PAS2, and a second planarization layer OC2.

The light emitting elements EL may be provided on the thin-film transistor layer TFTL. Each of the light emitting elements EL may include the first electrode AE, a second electrode CE, and the light emitting diode ED.

The first electrode AE may be provided on the first planarization layer OC1. For example, the first electrode AE may be disposed on a first bank BNK1 disposed on the first planarization layer OC1 to cover the first bank BNK1. The first electrode AE may overlap one of the first to third light emitting areas LA1, LA2, and LA3 defined by the second banks BNK2. In some embodiments, the first electrode AE may be connected to the drain electrode DE of each thin-film transistor TFT. The first electrode AE may be, but is not limited to, an anode of each light emitting element EL.

The second electrode CE may be disposed on the first planarization layer OC1 and spaced from the first electrode AE. For example, the second electrode CE may be disposed on a first bank BNK1 disposed on the first planarization layer OC1 to cover the first bank BNK1. The second electrode CE may overlap one of the first to third light emitting areas LA1, LA2, and LA3 defined by the second banks BNK2. For example, the second electrode CE may receive a common voltage supplied to all pixels. The second electrode CE may be, but is not limited to, a cathode of each light emitting element EL.

The first insulating layer IL1 may cover a part of the first electrode AE and a part of the second electrode CE which are adjacent to each other and may insulate the first electrode AE and the second electrode CE from each other.

The light emitting diode ED may be disposed above the first planarization layer OC1 between the first electrode AE and the second electrode CE. The light emitting diode ED may be disposed on the first insulating layer IL1. An end of the light emitting diode ED may be connected to the first electrode AE, and the other end of the light emitting diode ED may be connected to the second electrode CE. For example, a plurality of light emitting diodes ED may include active layers having the same material to emit light of the same wavelength band or light of the same color. Light emitted from the first to third light emitting areas LA1, LA2 and LA3 may have the same color. For example, the light emitting diodes ED may emit light of the third color or blue light having a peak wavelength of 440 to 480 nm. Therefore, the light emitting element layer EML may emit light of the third color or blue light.

The second banks BNK2 may be disposed on the first planarization layer OC1 to define the first to third light emitting areas LA1, LA2, and LA3. For example, the second banks BNK2 may surround each of the first to third light emitting areas LA1, LA2 and LA3, but the present disclosure is not limited thereto. The second banks BNK2 may separate and insulate the respective first electrodes AE or second electrodes CE of the light emitting elements EL. The second banks BNK2 may be disposed in the first through third light blocking areas BA1 through BA3.

The second passivation layer PAS2 may be disposed on the light emitting elements EL and the second banks BNK2. The second passivation layer PAS2 may cover the light emitting elements EL and protect the light emitting elements EL. The second passivation layer PAS2 may prevent damage to the light emitting elements EL by preventing penetration of impurities such as moisture or air from the outside.

The second planarization layer OC2 may be provided on the second passivation layer PAS2 to planarize the top of the light emitting element layer EML. The second planarization layer OC2 may include an organic material. For example, the second planarization layer OC2 may include at least one of acryl resin, epoxy resin, phenolic resin, polyamide resin, and polyimide resin.

The wavelength conversion layer WLCL may include a first capping layer CAP1, first light blocking members BK1, a first wavelength conversion part WLC1, a second wavelength conversion part WLC2, a light transmission part LTU, a second capping layer CAP2, and a third planarization layer OC3.

The first capping layer CAP1 may be disposed on the second planarization layer OC2 of the light emitting element layer EML. The first capping layer CAP1 may seal lower surfaces of the first and second wavelength conversion parts WLC1 and WLC2 and the light transmission part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light blocking members BK1 may be disposed on the first capping layer CAP1 in the first to third light blocking areas BA1, BA2, and BA3. The first light blocking members BK1 may overlap the second banks BNK2 in the thickness direction of the substrate SUB. The first light blocking members BK1 may block transmission of light. The first light blocking members BK1 may prevent color mixing by preventing intrusion of light between the first to third light emitting areas LA1, LA2, and LA3, thereby improving a color gamut. The first light blocking members BK1 may be disposed in a lattice shape surrounding the first to third light emitting areas LA1, LA2, and LA3 in a plan view.

The first light blocking members BK1 may include an organic light blocking material and a liquid repellent component. Here, the liquid repellent component may be made of a fluorine-containing monomer or a fluorine-containing polymer, specifically, may include fluorine-containing aliphatic polycarbonate. For example, the first light blocking members BK1 may be made of a black organic material including a liquid repellent component. The first light blocking members BK1 may be formed by coating and exposing an organic light blocking material including a liquid repellent component.

The first light blocking members BK1 including a liquid repellent component may separate the first and second wavelength conversion parts WLC1 and WLC2 and the light transmission part LTU into corresponding light emitting areas LA. For example, when the first and second wavelength conversion parts WLC1 and WLC2 and the light transmission part LTU are formed using an inkjet method, an ink composition may flow on upper surfaces of the first light blocking members BK1. In this case, the first light blocking members BK1 including a liquid repellent component may guide the ink composition to flow into each light emitting area of the first to third light emitting areas LA1, LA2, and LA3. Therefore, the first light blocking members BK1 can prevent mixing of the ink composition.

The first wavelength conversion part WLC1 may be disposed on the first capping layer CAP1 in the first light emitting area LA1. The first wavelength conversion part WLC1 may be surrounded by the first light blocking members BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide (TiO$_2$), zirconium oxide (ZrO$_2$), aluminum oxide (Al$_2$O$_3$), indium oxide (In$_2$O$_3$), zinc oxide (ZnO) or tin oxide (SnO$_2$) or may include organic particles such as acrylic resin or urethane resin. The first scatterers SCT1 may scatter incident light in random directions regardless of the incident direction of the incident light without substantially converting the peak wavelength of the incident light.

The first wavelength shifters WLS1 may convert or shift the peak wavelength of incident light into a first peak wavelength. For example, the first wavelength shifters WLS1 may convert blue light provided by the display device 10 into red light having a single peak wavelength of 610 to 650 nm and emit the red light. The first wavelength shifters WLS1 may be quantum dots, quantum rods, or phosphors. The quantum dots may be particulate materials that emit light of a specific color when electrons transition from a conduction band to a valence band.

For example, the quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots include Group IV nanocrystals, Group II-VI compound nanocrystals, Group III-V compound nanocrystals, Group IV-VI nanocrystals, and combinations of the same.

For example, the quantum dots may have a core-shell structure including a core containing the above-described nanocrystal and a shell surrounding the core. The shell of each quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of an element present in the shell is reduced toward the center. The shell of each quantum dot may be, for example, a metal or non-metal oxide, a semiconductor compound, or a combination of the same.

Light emitted from the first wavelength shifters WLS1 may have a full width of half maximum (FWHM) of an emission wavelength spectrum of 45 nm or less, 40 nm or less, or 30 nm or less. Therefore, the color purity and color reproducibility of the display device 10 can be further improved. In some embodiments, the light emitted from the first wavelength shifters WLS1 may be radiated in various directions regardless of the incident direction of incident light. Therefore, the lateral visibility of red displayed in the first light emitting area LA1 can be improved.

A part of blue light provided by the light emitting element layer EML may be transmitted through the first wavelength conversion part WLC1 without being converted into red light by the first wavelength shifters WLS1. Of the blue light provided by the light emitting element layer EML, light incident on a first color filter CF1 without being converted by the first wavelength conversion part WLC1 may be blocked by the first color filter CF1. In some embodiments, red light into which the blue light provided by the light emitting element layer EML has been converted by the first wavelength conversion part WLC1 may be emitted to the outside through the first color filter CF1. Therefore, the first light emitting area LA1 may emit red light.

The second wavelength conversion part WLC2 may be disposed on the first capping layer CAP1 in the second light emitting area LA2. The second wavelength conversion part WLC2 may be surrounded by the first light blocking members BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of any of the materials exemplified in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be made of any of the materials exemplified in the description of the first scatterers SCT1. The second scatterers SCT2 may scatter incident light in random directions regardless of the incident direction of the incident light without substantially converting the peak wavelength of the incident light.

The second wavelength shifters WLS2 may convert or shift the peak wavelength of incident light into a second peak wavelength different from the first peak wavelength of the first wavelength shifters WLS1. For example, the second wavelength shifters WLS2 may convert blue light provided by the display device 10 into green light having a single peak wavelength of 510 to 550 nm and emit the green light. The second wavelength shifters WLS2 may be quantum dots, quantum rods, or phosphors. The second wavelength shifters WLS2 may include a material having the same purpose as the materials exemplified in the description of the first wavelength shifters WLS1. The second wavelength shifters WLS2 may be made of quantum dots, quantum rods, or phosphors such that their wavelength conversion range is different from the wavelength conversion range of the first wavelength shifters WLS1.

The light transmission part LTU may be disposed on the first capping layer CAP1 in the third light emitting area LA3. The light transmission part LTU may be surrounded by the first light blocking members BK1. The light transmission part LTU may transmit incident light while maintaining the peak wavelength of the incident light. The light transmission part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first or second base resin BS1 or BS2 or may be made of any of the materials exemplified in the description of the first or second base resin BS1 or BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first or second scatterers SCT1 or SCT2 or may be made of any of the materials exemplified in the description of the first or second scatterers SCT1 or SCT2. The third scatterers SCT3 may scatter incident light in random directions regardless of the incident direction of the incident light without substantially converting the peak wavelength of the incident light.

Because the wavelength conversion layer WLCL is directly disposed on the second planarization layer OC2 of the light emitting element layer EML, the display device 10 may not require a separate substrate for the first and second wavelength conversion parts WLC1 and WLC2 and the light transmission part LTU. Therefore, the first and second wavelength conversion parts WLC1 and WLC2 and the light transmission part LTU can be easily aligned in the first to third light emitting areas LA1, LA2, and LA3, respectively, and the thickness of the display device 10 can be relatively reduced.

The second capping layer CAP2 may cover the first and second wavelength conversion parts WLC1 and WLC2, the light transmission part LTU, and the first light blocking members BK1. For example, the second capping layer CAP2 may prevent damage to or contamination of the first and second wavelength conversion parts WLC1 and WLC2 and the light transmission part LTU by sealing the first and second wavelength conversion parts WLC1 and WLC2 and the light transmission part LTU. The second capping layer CAP2 may be made of the same material as the first capping layer CAP1 or may be made of any of the materials exemplified in the description of the first capping layer CAP1.

A third planarization layer OC3 may be disposed on the second capping layer CAP2 to planarize the tops of the first and second wavelength conversion parts WLC1 and WLC2 and the light transmission part LTU. The third planarization layer OC3 may include an organic material. For example, the third planarization layer OC3 may include at least one of acryl resin, epoxy resin, phenolic resin, polyamide resin, and polyimide resin.

The color filter layer CFL may include second light blocking members BK2, first to third color filters CF1, CF2, and CF3, and a third passivation layer PAS3.

The second light blocking members BK2 may be disposed on the third planarization layer OC3 of the wavelength conversion layer WLCL in the first to third light blocking areas BA1, BA2, and BA3. The second light blocking members BK2 may overlap the first light blocking members BK1 or the second banks BNK2 in the thickness direction of the substrate SUB. The second light blocking members BK2 may block transmission of light. The second light blocking members BK2 may prevent color mixing by preventing intrusion of light between the first to third light emitting areas LA1, LA2, and LA3, thereby improving the color gamut. The second light blocking members BK2 may be disposed in a lattice shape surrounding the first to third light emitting areas LA1, LA2, and LA3 in a plan view.

The first color filter CF1 may be disposed on the third planarization layer OC3 in the first light emitting area LA1. The first color filter CF1 may be surrounded by the second light blocking members BK2. The first color filter CF1 may overlap the first wavelength conversion part WLC1 in the thickness direction of the substrate SUB. The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant. The red colorant may be made of red dye or red pigment.

The second color filter CF2 may be disposed on the third planarization layer OC3 in the second light emitting area LA2. The second color filter CF2 may be surrounded by the second light blocking members BK2. The second color filter CF2 may overlap the second wavelength conversion part WLC2 in the thickness direction of the substrate SUB. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant. The green colorant may be made of green dye or green pigment.

The third color filter CF3 may be disposed on the third planarization layer OC3 in the third light emitting area LA3. The third color filter CF3 may be surrounded by the second light blocking members BK2. The third color filter CF3 may overlap the light transmission part LTU in the thickness direction of the substrate SUB. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant. The blue colorant may be made of blue dye or blue pigment.

The first to third color filters CF1, CF2, and CF3 may absorb a part of light coming from the outside of the display device 10, thereby reducing reflected light due to the external light. Therefore, the first to third color filters CF1, CF2, and CF3 may prevent color distortion due to reflection of external light.

Because the first to third color filters CF1, CF2, and CF3 are directly disposed on the third planarization layer OC3 of the wavelength conversion layer WLCL, the display device 10 may not require a separate substrate for the first to third color filters CF1, CF2, and CF3. Therefore, the thickness of the display device 10 can be relatively reduced.

A third passivation layer PAS3 may cover the first to third color filters CF1, CF2, and CF3. The third passivation layer PAS3 may protect the first to third color filters CF1, CF2, and CF3.

The encapsulation layer TFE may be disposed on the third passivation layer PAS3 of the color filter layer CFL. The encapsulation layer TFE may cover upper and side surfaces of a display layer. For example, the encapsulation layer TFE may include at least one inorganic layer to prevent penetration of oxygen or moisture. In some embodiments, the encapsulation layer TFE may include at least one organic layer to protect the display device 10 from foreign substances such as dust.

Figure 4:
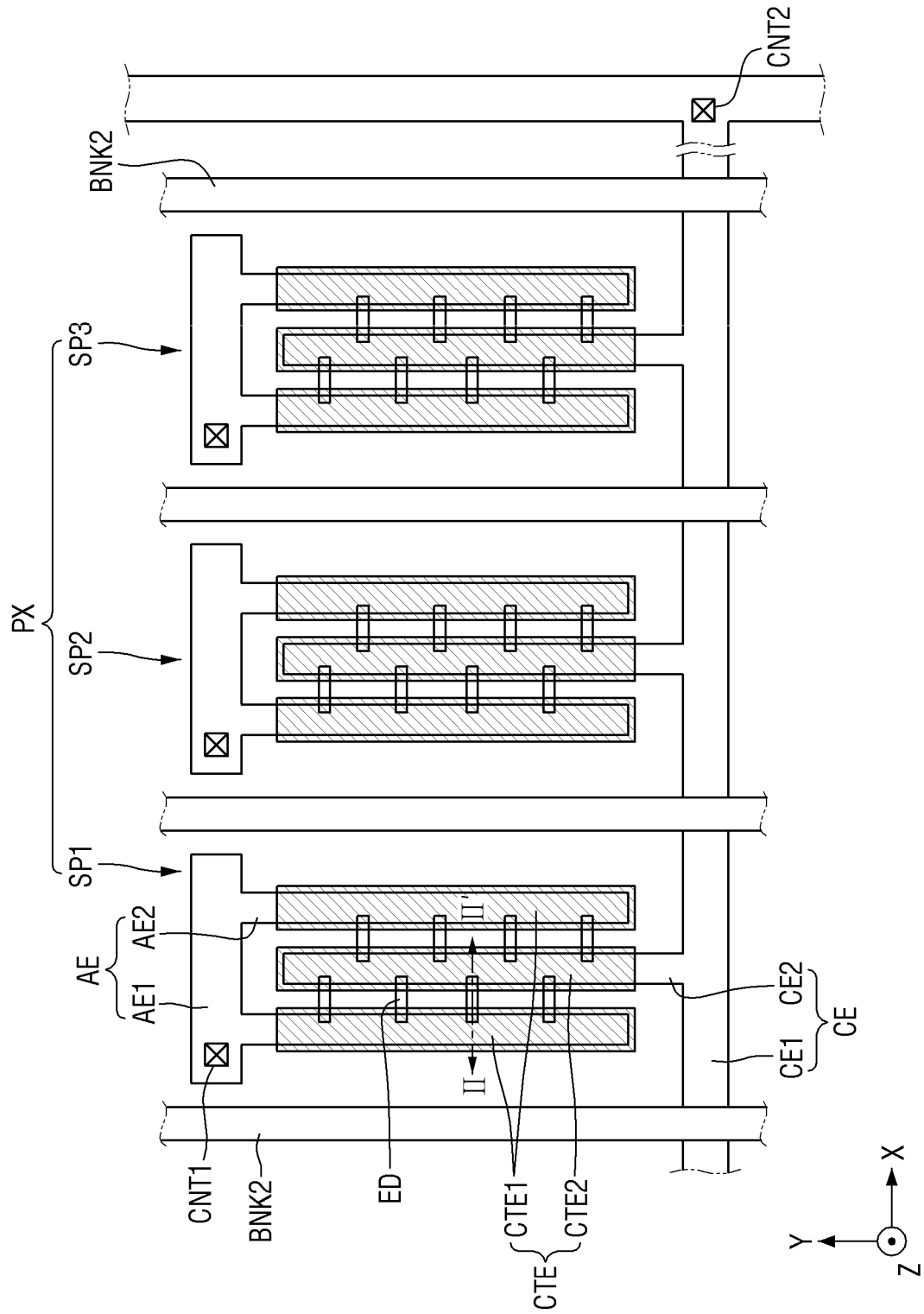
FIG. 4 is a plan view of a pixel of the display device according to an embodiment.

FIG. 4 is a plan view of a pixel PX of the display device 10 according to AN embodiment.

Referring to FIG. 4, each of a plurality of pixels PX may include first to third sub pixels SP1, SP2, and SP3. The first to third sub pixels SP1, SP2, and SP3 may correspond to the first to third light emitting areas LA1, LA2, and LA3, respectively. The light emitting diodes ED of the first to third sub pixels SP1, SP2, and SP3 may emit light through the first to third light emitting areas LA1, LA2, and LA3, respectively.

The first to third sub pixels SP1, SP2, and SP3 may emit light of the same color. For example, the first to third sub pixels SP1, SP2, and SP3 may include the same type of light emitting diodes ED and emit light of the third color or blue light. For another example, the first sub pixel SP1 may emit light of the first color or red light, the second sub pixel SP2 may emit light of the second color or green light, and the third sub pixel SP3 may emit light of the third color or blue light.

Each of the first to third sub pixels SP1, SP2, and SP3 may include the first and second electrodes AE and CE, the light emitting diodes ED, a plurality of contact electrodes CTE, and a plurality of second banks BNK2.

The first and second electrodes AE and CE may be electrically connected to the light emitting diodes ED to receive a voltage (e.g., a set or predetermined voltage), and the light emitting diodes ED may emit light of a specific wavelength band. At least a part of each of the first and second electrodes AE and CE may form an electric field in the pixel PX, and the light emitting diodes ED may be aligned by the electric field.

For example, the first electrode AE may be a pixel electrode separate for each of the first to third sub pixels SP1, SP2, and SP3, and the second electrode CE may be a common electrode connected in common to the first to third sub pixels SP1, SP2, and SP3. Any one of the first electrode AE and the second electrode CE may be an anode of each light emitting diode ED, and the other one may be a cathode of each light emitting diode ED.

The first electrode AE may include a first electrode stem part AE1 extending in the first direction (X-axis direction) and one or more first electrode branch parts AE2 branching from the first electrode stem part AE1 to extend in a direction opposite to the second direction (Y-axis direction).

The first electrode stem part AE1 of each of the first to third sub pixels SP1, SP2, and SP3 may be spaced from the first electrode stem part AE1 of an adjacent sub pixel and may be disposed on an imaginary extension line of the first electrode stem part AE1 of the sub pixel adjacent in the first direction (X-axis direction). The respective first electrode stem parts AE1 of the first to third sub pixels SP1, SP2, and SP3 may receive different signals and may be driven independently.

The first electrode branch parts AE2 may branch from the first electrode stem part AE1 to extend in the direction opposite to the second direction (Y-axis direction). An end of each first electrode branch part AE2 may be connected to the first electrode stem part AE1, and the other end of each first electrode branch part AE2 may be spaced from a second electrode stem part CE1 facing the first electrode stem part AE1.

The second electrode CE may include the second electrode stem part CE1 extending in the first direction (X-axis direction) and a second electrode branch part CE2 branching from the second electrode stem part CE1 to extend in the second direction (Y-axis direction). The second electrode stem part CE1 of each of the first to third sub pixels SP1, SP2, and SP3 may be connected to the second electrode stem part CE1 of an adjacent sub pixel. The second electrode stem part CE1 may extend in the first direction (X-axis direction) across a plurality of pixels PX (and across the first to third sub pixels SP1, SP2, and SP3 of each pixel PX). The second electrode stem part CE1 may be connected to the periphery of the display area DA or a part extending in a direction in the non-display area NDA.

The second electrode branch part CE2 may be spaced from the first electrode branch parts AE2 to face them. An end of the second electrode branch part CE2 may be connected to the second electrode stem part CE1, and the other end of the second electrode branch part CE2 may be spaced from the first electrode stem part AE1.

The first electrode AE may be electrically connected to the thin-film transistor layer TFTL of the display device 10 through a first contact hole CNT1, and the second electrode CE may be electrically connected to the thin-film transistor layer TFTL of the display device 10 through a second contact hole CNT2. For example, the first contact hole CNT1 may be disposed in each first electrode stem part AE1, and the second contact hole CNT2 may be disposed in the second electrode stem part CE1, but the present disclosure is not limited thereto.

The second banks BNK2 may be disposed at boundaries between a plurality of pixels PX (and across the first to third sub pixels SP1, SP2, and SP3 of each pixel PX). A plurality of first electrode stem parts AE1 may be spaced from each other by the second banks BNK2. The second banks BNK2 may extend in the second direction (Y-axis direction) and may be disposed at the boundaries of sub pixels SP arranged in the first direction (X-axis direction). Additionally, the second banks BNK2 may be disposed at the boundaries of sub pixels SP arranged in the second direction (Y-axis direction). The second banks BNK2 may define the boundaries of the pixels PX or the boundaries of each of the sub pixels.

The second banks BNK2 may prevent ink from crossing the boundaries of adjacent pixels SP when the ink in which the light emitting diodes ED are dispersed is sprayed during the manufacture of the display device 10. The second banks BNK2 may separate inks in which different light emitting diodes ED are dispersed so that the inks are not mixed with each other.

The light emitting diodes ED may be disposed between the first electrode AE and the second electrode CE. First ends of the light emitting diodes ED may be connected to the first electrode AE, and second ends of the light emitting diodes ED may be connected to the second electrode CE. For example, the light emitting diodes ED may be connected to the first electrode AE through first contact electrodes CTE1 and may be connected to the second electrode CE through a second contact electrode CTE2.

The light emitting diodes ED may be spaced from each other and aligned substantially parallel to each other. A gap between the light emitting diodes ED is not particularly limited. Some of the light emitting diodes ED may be disposed adjacent to each other, some other ones of the light emitting diodes ED may be spaced from each other (e.g., spaced from each other by a set or predetermined distance), and some other ones of the light emitting diodes ED may be disposed with non-uniform density but may be aligned in a specific direction. For example, each of the light emitting diodes ED may be disposed in a direction perpendicular to the direction in which each first electrode branch part AE2 or the second electrode branch part CE2 extends. For another example, each of the light emitting diodes ED may be disposed in a direction oblique to the direction in which each first electrode branch part AE2 or the second electrode branch part CE2 extends.

The light emitting diodes ED may include active layers having the same material to emit light of the same wavelength band or light of the same color. The first to third sub pixels SP1, SP2, and SP3 may emit light of the same color. For example, the light emitting diodes ED may emit light of the third color or blue light having a peak wavelength of 440 to 480 nm. Therefore, the light emitting element layer EML of the display device 10 may emit light of the third color or blue light. For another example, the first to third sub pixels SP1, SP2, and SP3 may include light emitting diodes ED having different active layers to emit light of different colors.

The contact electrodes CTE may include the first and second contact electrodes CTE1 and CTE2. The first contact electrodes CTE1 may cover the first electrode branch parts AE2 and a part of each light emitting diode ED and may electrically connect the first electrode branch parts AE2 and the light emitting diodes ED to each other. The second contact electrode CTE2 may cover the second electrode branch part CE2 and another part of each light emitting diode ED and may electrically connect the second electrode branch part CE2 and the light emitting diodes ED.

The first contact electrodes CTE1 may be disposed on the first electrode branch parts AE2 to extend in the second direction (Y-axis direction). The first contact electrodes CTE1 may contact the first ends of the light emitting diodes ED. The light emitting diodes ED may be electrically connected to the first electrode AE through the first contact electrodes CTE1.

The second contact electrode CTE2 may be disposed on the second electrode branch part CE2 to extend in the second direction (Y-axis direction). The second contact electrode CTE2 may be spaced from the first contact electrodes CTE1 in the first direction (X-axis direction). The second contact electrode CTE2 may contact the second ends of the light emitting diodes ED. The light emitting diodes ED may be electrically connected to the second electrode CE through the second contact electrode CTE2.

For example, respective widths of the first and second contact electrodes CTE1 and CTE2 may be greater than respective widths of the first and second electrode branch parts AE2 and CE2. For another example, the first and second contact electrodes CTE1 and CTE2 may cover respective sides of the first and second electrode branch parts AE2 and CE2, respectively.

Figure 5:
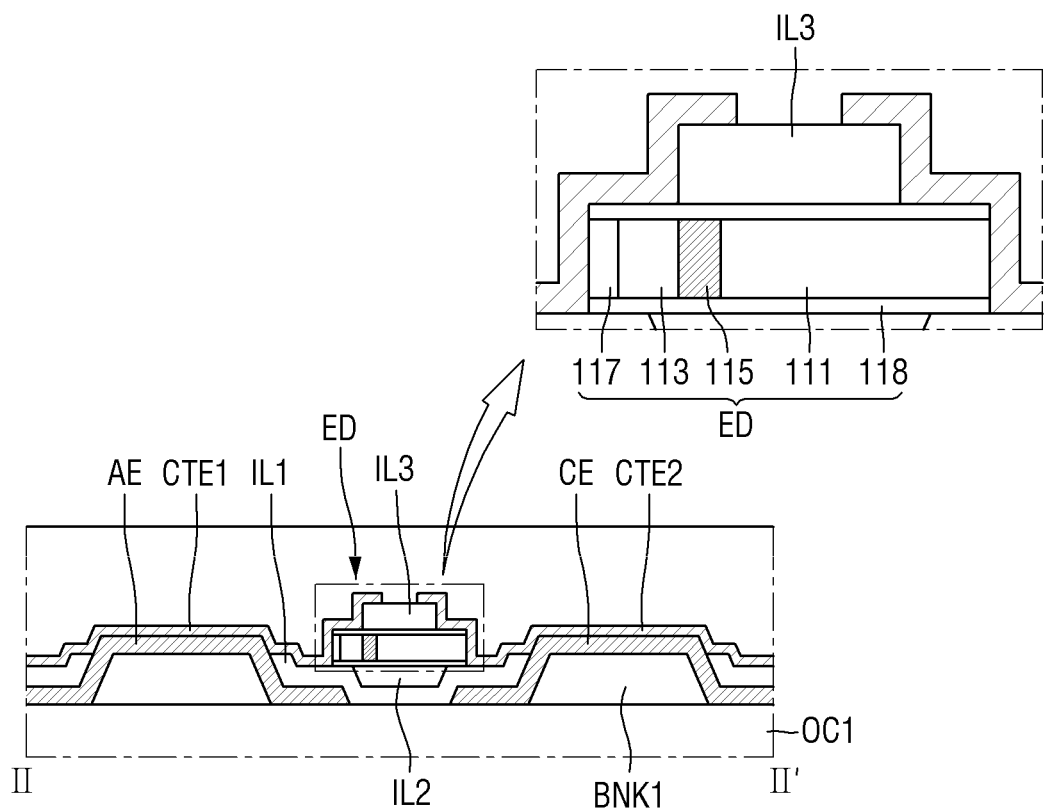
FIG. 5 is a cross-sectional view taken along the line II-II' of FIG. 4.

FIG. 5 is a cross-sectional view taken along the line II-II' of FIG. 4.

Referring to FIG. 5, the light emitting element layer EML of the display device 10 may be disposed on the thin-film transistor layer TFTL and may include first to third insulating layers IL1, IL2, and IL3.

A plurality of first banks BNK1 may be disposed in each of the first to third light emitting areas LA1, LA2, and LA3. Each of the first banks BNK1 may correspond to the first electrode AE or the second electrode CE. Each of the first and second electrodes AE and CE may be disposed on a corresponding first bank BNK1. For example, each of the first and second electrode branch parts AE2 and CE2 may be disposed on a corresponding first bank BNK1. The first banks BNK1 may include, but are not limited to, polyimide (PI).

The first banks BNK1 may be disposed on the first planarization layer OC1, and side surfaces of each of the first banks BNK1 may be inclined from the first planarization layer OC1. For example, each of the first and second electrodes AE and CE may include a material having high reflectivity and may be disposed on the inclined surfaces of a first bank BNK1 to reflect light incident from a light emitting diode ED to above the display device 10.

Referring to FIG. 5 in conjunction with FIG. 4, the first electrode stem part AE1 may include the first contact hole CNT1 penetrating the first planarization layer OC1. The first electrode stem part AE1 may be electrically connected to a thin-film transistor TFT through the first contact hole CNT1. Therefore, the first electrode AE may receive an electrical signal (e.g., a set or predetermined electrical signal) from the thin-film transistor TFT.

The second electrode stem part CE1 may extend in the first direction (X-axis direction) and may also be disposed in the non-light emitting area in which the light emitting diode ED is not disposed. The second electrode stem part CE1 may include the second contact hole CNT2 penetrating the first planarization layer OC1. The second electrode stem part CE1 may be electrically connected to a power electrode through the second contact hole CNT2. The second electrode CE may receive an electrical signal (e.g., a set or predetermined electrical signal) from the power electrode.

The first and second electrodes AE and CE may include a transparent conductive material. For example, each of the first and second electrodes AE and CE may include, but is not limited to, at least one of indium tin oxide (ITO), indium zinc oxide (IZO), and indium tin zinc oxide (ITZO).

The first and second electrodes AE and CE may include a conductive material having high reflectivity. For example, the first and second electrodes AE and CE may include a metal having high reflectivity, such as silver (Ag), copper (Cu), or aluminum (Al). The first and second electrodes AE and CE may reflect light incident from the light emitting diode ED to above the display device 10.

Each of the first and second electrodes AE and CE may have a structure in which a transparent conductive material and a metal having high reflectivity are each stacked in one or more layers or may be formed as a single layer including them. For example, each of the first and second electrodes AE and CE may have a stacked structure of ITO/Ag/ITO/IZO or may be an alloy including aluminum (Al), nickel (Ni), lanthanum (La) or the like, but the present disclosure is not limited thereto.

The first insulating layer IL1 may be disposed on the first planarization layer OC1, the first electrode AE, and the second electrode CE. The first insulating layer IL1 may cover a part of each of the first and second electrodes AE and CE. For example, the first insulating layer IL1 may expose parts of the first and second electrodes AE and CE which correspond to upper surfaces of the first banks BNK1 and may cover parts of the first and second electrodes AE and CE which do not correspond to the upper surfaces of the first banks BNK1. Therefore, the first insulating layer IL1 may include openings that expose the parts of the first and second electrodes AE and CE which correspond to the upper surfaces of the first banks BNK1.

For example, the first insulating layer IL1 may include an inorganic insulating material and include a step recessed between the first and second electrodes AE and CE. The second insulating layer IL2 may fill the recessed step of the first insulating layer IL1. Therefore, the second insulating layer IL2 may planarize an upper surface of the first insulating layer IL1, and the light emitting diode ED may be disposed on the first and second insulating layers IL1 and IL2.

The first insulating layer IL1 may protect the first and second electrodes AE and CE and insulate the first and second electrodes AE and CE from each other. The first insulating layer IL1 may prevent the light emitting diode ED from directly contacting other members and thus being damaged.

The light emitting diode ED may be disposed on the first and second insulating layers IL1 and IL2 between the first electrode AE and the second electrode CE. The first end of the light emitting diode ED may be connected to the first electrode AE, and the second end of the light emitting diode ED may be connected to the second electrode CE. For example, the light emitting diode ED may be connected to the first electrode AE through a first contact electrode CTE1 and may be connected to the second electrode CE through the second contact electrode CTE2.

The third insulating layer IL3 may be disposed on a part of the light emitting diode ED disposed between the first and second electrodes AE and CE. The third insulating layer IL3 may partially cover an outer surface of the light emitting diode ED. The third insulating layer IL3 may protect the light emitting diode ED.

The contact electrodes CTE may include the first and second contact electrodes CTE1 and CTE2. The first contact electrode CTE1 may cover a first electrode branch part AE2 and a part of the light emitting diode ED and may electrically connect the first electrode branch part AE2 and the light emitting diode ED. The second contact electrode CTE2 may cover the second electrode branch part CE2 and another part of the light emitting diode ED and may electrically connect the second electrode branch part CE2 and the light emitting diode ED.

The contact electrodes CTE may include a conductive material. For example, the first and second contact electrodes CTE1 and CTE2 may include, but are not limited to, ITO, IZO, ITZO, or aluminum (Al).

Figure 6:
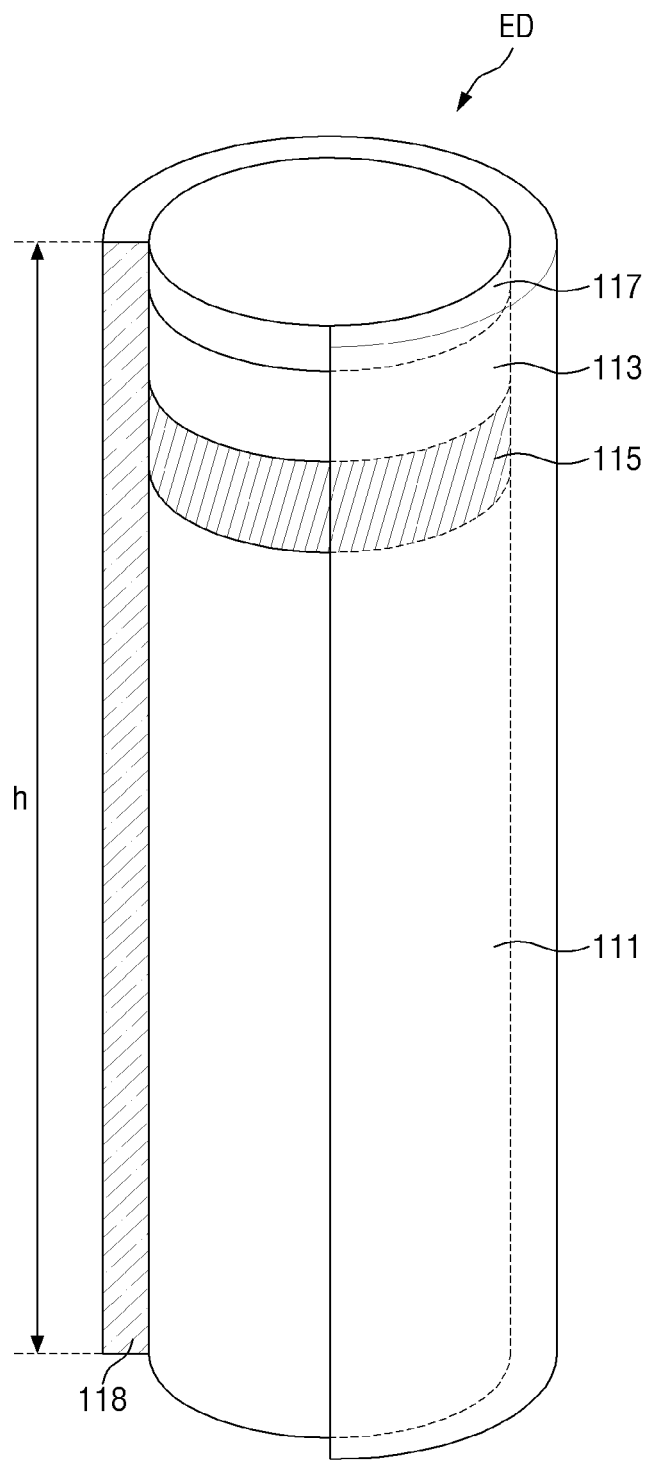
FIG. 6 illustrates a perspective cutaway view of a light emitting element according to an embodiment.

FIG. 6 illustrates a perspective cutaway view of a light emitting diode ED according to an embodiment.

Referring to FIG. 6, the light emitting diode ED may be provided. For example, the light emitting diode ED may be an inorganic light emitting diode having a size of nanometers or micrometers and made of an inorganic material. When an electric field is formed in a specific direction between two electrodes facing each other (or opposite each other), the inorganic light emitting diode may be aligned between the two electrodes in which polarities are formed. The light emitting diode ED may be aligned between the two electrodes by the electric field formed on the two electrodes.

The light emitting diode ED according to the embodiment may extend in one direction. The light emitting diode ED may be shaped like a cylinder, a rod, a wire, a tube, or the like. However, the shape of the light emitting diode ED is not limited thereto, and the light emitting diode ED may also have various shapes including polygonal prisms, such as a cube, a rectangular parallelepiped and a hexagonal prism, and a shape extending in a direction and having a partially inclined outer surface. A plurality of semiconductors included in the light emitting diode ED may be sequentially disposed or stacked along the one direction (e.g., an extension direction of the light emitting diode ED).

The light emitting diode ED may include a semiconductor layer doped with impurities of any conductivity type (e.g., a p type or an n type). The semiconductor layer may receive an electrical signal from an external power source and emit light of a specific wavelength band.

The light emitting diode ED may include a first semiconductor layer 111, a second semiconductor layer 113, an active layer 115, an electrode layer 117, and an insulating film 118.

The first semiconductor layer 111 may be an n-type semiconductor. For example, when the light emitting diode ED emits blue light, the first semiconductor layer 111 may include a semiconductor material having a chemical formula of $Al_xGa_yIn_{1-x-y}N$ ($0 \leq x \leq 1$, $0 \leq x \leq 1$, $0 \cdot x+y \leq 1$). The first semiconductor layer 111 may include at least one semiconductor material selected from n-type doped AlGaInN, GaN, AlGaN, InGaN, AlN, and InN. The first semiconductor layer 111 may be doped with an n-type dopant such as Si, Ge, or Sn. The first semiconductor layer 111 may be n-GaN doped with n-type Si. A length of the first semiconductor layer 111 may be, but is not limited to, in the range of 1.5 to 5 μm.

The second semiconductor layer 113 may be disposed on the active layer 115. For example, when the light emitting diode ED emits blue light or green light, the second semiconductor layer 113 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 113 may include at least one semiconductor material selected from p-type doped AlGaInN, GaN, AlGaN, InGaN, AlN, and InN. The second semiconductor layer 113 may be doped with a p-type dopant such as Mg, Zn, Ca, Se, or Ba. The second semiconductor layer 113 may be p-GaN doped with p-type Mg. A length of the second semiconductor layer 113 may be, but is not limited to, in the range of 0.05 to 0.10 μm.

Each of the first and second semiconductor layers 111 and 113 may be formed as a single layer, but the present disclosure is not limited thereto. For example, each of the first and second semiconductor layers 111 and 113 may have a plurality of layers including a clad layer or a tensile strain barrier reducing (TSBR) layer.

The active layer 115 may be disposed between the first and second semiconductor layers 111 and 113. The active layer 115 may include a material having a single or multiple quantum well structure. When the active layer 115 includes a material having a multiple quantum well structure, it may have a structure in which a plurality of quantum layers and a plurality of well layers are alternately stacked. The active layer 115 may emit light through combination of electron-hole pairs according to electrical signals received through the first and second semiconductor layers 111 and 113. For example, when the active layer 115 emits blue light, it may include a material such as AlGaN or AlGaInN. When the active layer 115 has a multiple quantum well structure in which a quantum layer and a well layer are alternately stacked, the quantum layer may include a material such as AlGaN or AlGaInN, and the well layer may include a material such as GaN or AlInN. The active layer 115 may include AlGaInN as a quantum layer and AlInN as a well layer to emit blue light.

For another example, the active layer 115 may have a structure in which a semiconductor material having a large band gap energy and a semiconductor material having a small band gap energy are alternately stacked or may include different Group 3 to 5 semiconductor materials depending on the wavelength band of light that it emits. Light emitted from the active layer 115 is not limited to blue light. In some cases, the active layer 115 may emit red or green light. A length of the active layer 115 may be, but is not limited to, in the range of 0.05 to 0.10 μm.

Light emitted from the active layer 115 may be radiated not only in a longitudinal direction of the light emitting diode ED but also toward both side surfaces of the light emitting diode LD. That is, the direction of light emitted from the active layer 115 is not limited.

The electrode layer 117 may be an ohmic contact electrode. Alternatively, the electrode layer 117 may be a Schottky contact electrode. The light emitting diode ED may include at least one electrode layer 117. When the light emitting diode ED is electrically connected to an electrode or a contact electrode CTE, the electrode layer 117 may reduce the resistance between the light emitting diode ED and the electrode or the contact electrode CTE. The electrode layer 117 may include a conductive metal. For example, the electrode layer 117 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 117 may include an n-type or p-type doped semiconductor material.

The insulating film 118 may surround outer surfaces (e.g., outer peripheral surfaces) of the semiconductor layers and the electrode layers. The insulating film 118 may surround an outer surface of the active layer 115 and extend in the direction in which the light emitting diode ED extends. The insulating film 118 may protect the light emitting diode ED. For example, the insulating film 118 may surround side surfaces of the light emitting diode ED and expose both ends of the light emitting diode ED in the longitudinal direction.

The insulating film 118 may include a material having insulating properties, such as silicon oxide ($SiO_x$), silicon nitride ($SiN_x$), silicon oxynitride ($SiO_xN_y$), aluminum nitride (AlN), or aluminum oxide ($Al_2O_3$). Therefore, the insulating film 118 may prevent an electrical short circuit that may occur when the active layer 115 directly contacts an electrode through which an electrical signal is transmitted to the light emitting diode ED. In some embodiments, the insulating film 118 may prevent a reduction in luminous efficiency by protecting the outer surface of the light emitting diode ED.

Figure 7:
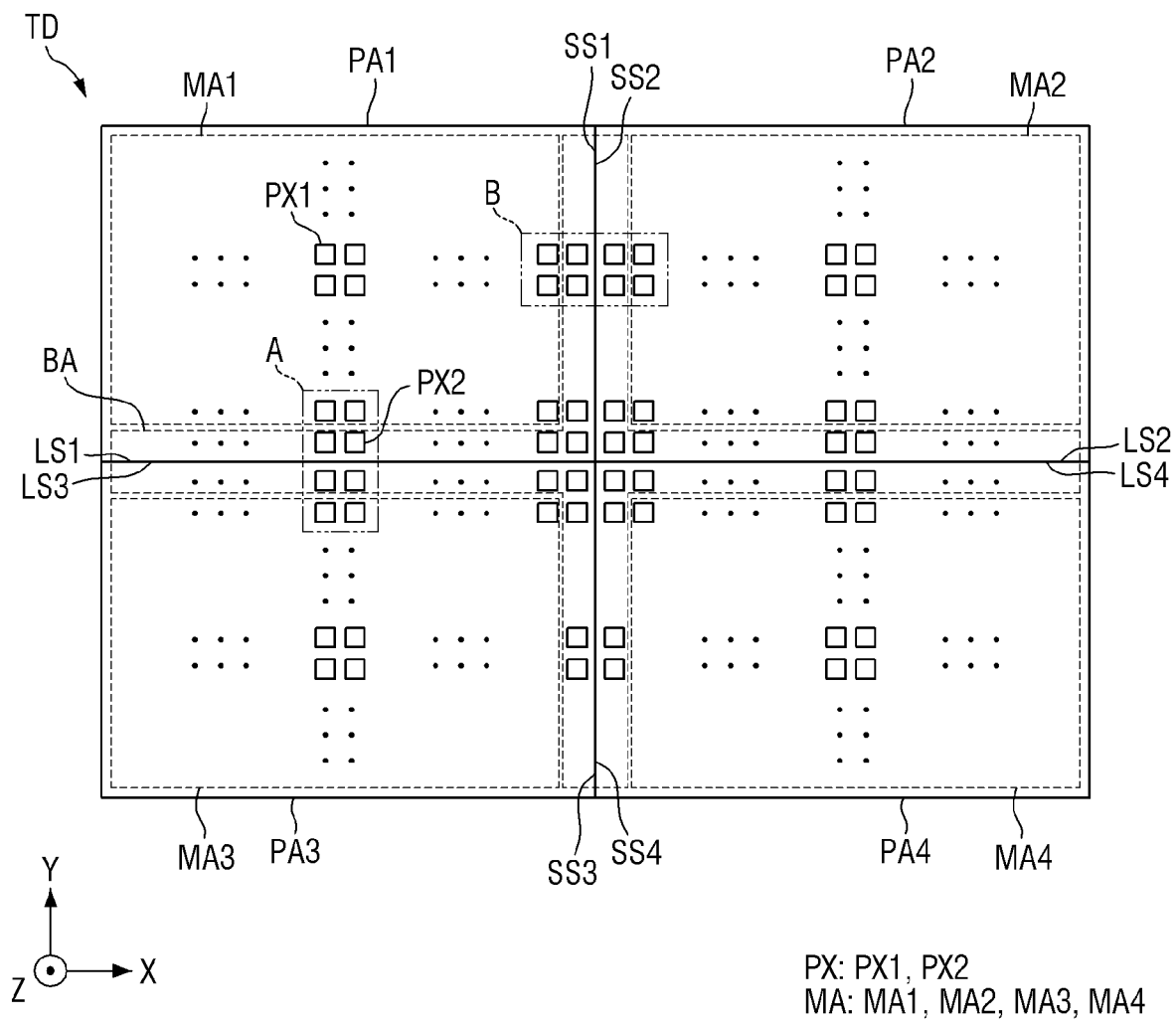
FIG. 7 is a plan view illustrating a coupling structure of a tiled display device according to an embodiment.
Figure 8:
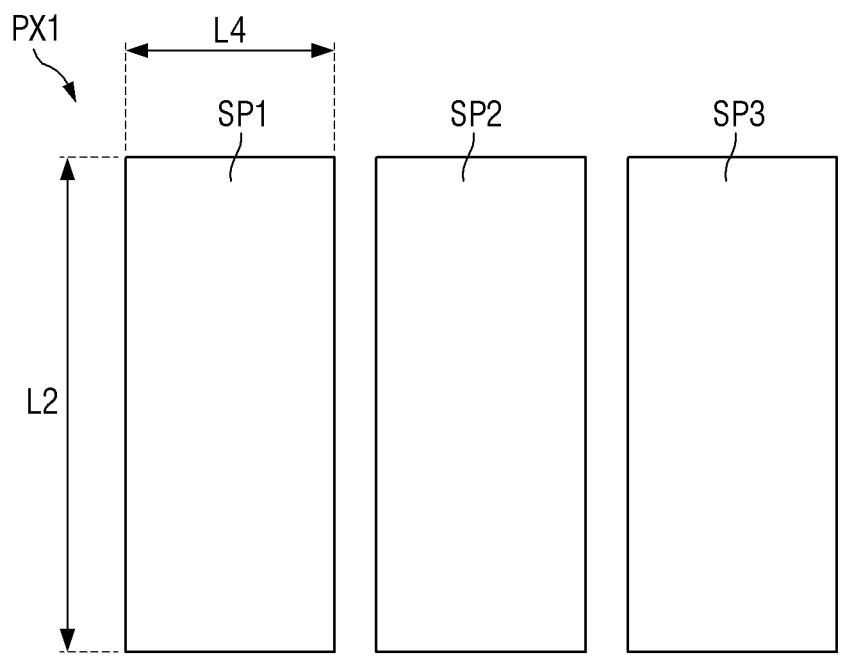
FIG. 8 is a plan view of a first pixel of the tiled display device according to the embodiment of FIG. 7.
Figure 8:
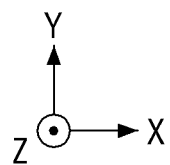
Figure 9:
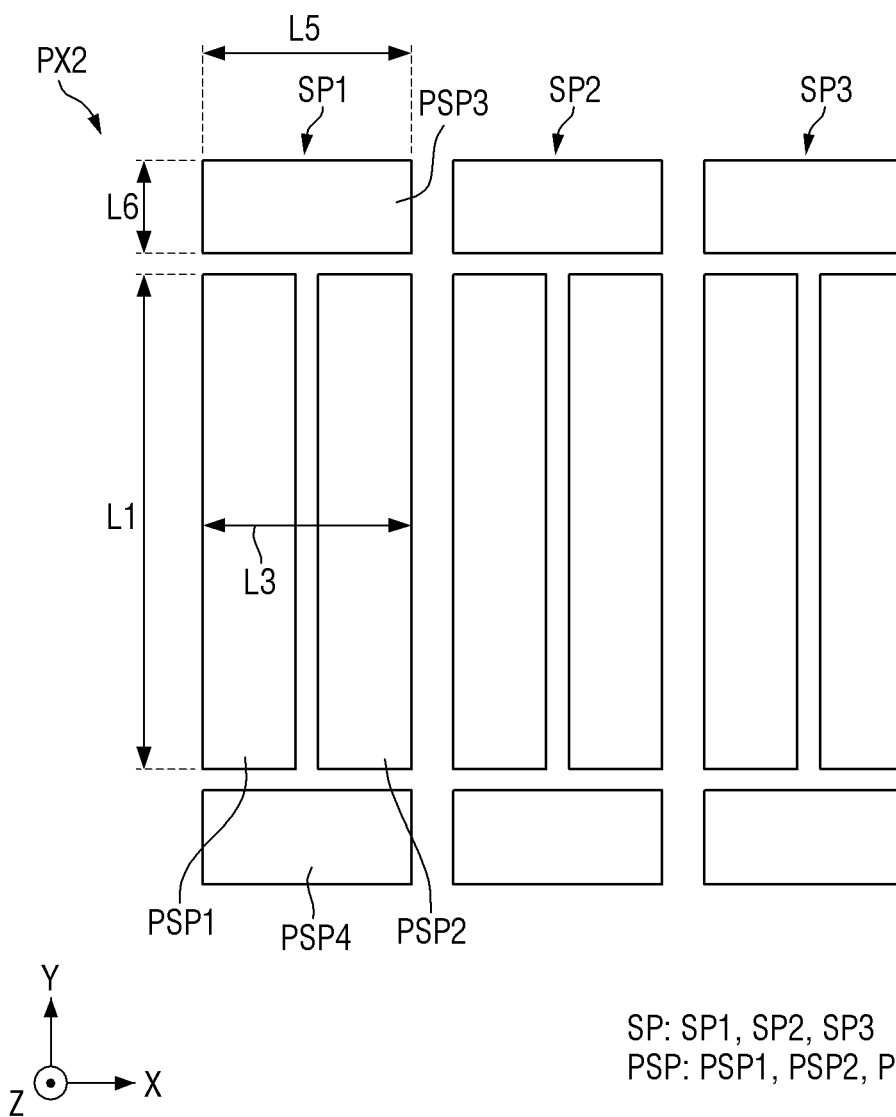
FIG. 9 is a plan view of a second pixel of the tiled display device according to the embodiment of FIG. 7.

FIG. 7 is a plan view illustrating the coupling structure of a tiled display device TD according to an embodiment. FIG. 8 is a plan view of a first pixel PX1 of the tiled display device TD according to the embodiment of FIG. 7. FIG. 9 is a plan view of a second pixel PX2 of the tiled display device TD according to the embodiment of FIG. 7.

Referring to FIG. 7, the tiled display device TD according to the embodiment may include a plurality of display devices PA1, PA2, PA3, and PA4. For example, the tiled display device TD may include a first display device PA1, a second display device PA2, a third display device PA3, and a fourth display device PA4. However, the number of display devices is not limited to the embodiment of FIG. 7. The number of display devices may be variously adjusted according to the size of the tiled display device TD. For example, two or more display devices may be disposed adjacent to each other in a direction.

Each of the display devices PA1, PA2, PA3, and PA4 may be shaped like a rectangle including long sides and short sides. Each long side of each of the display devices PA1, PA2, PA3, and PA4 may extend in the first direction (X-axis direction), and each short side of each of the display devices PA1, PA2, PA3, and PA4 may extend in the second direction (Y-axis direction). The long sides and short sides of the display devices PA1, PA2, PA3, and PA4 may be disposed adjacent to each other or may contact each other. For example, a first short side SS1 of the first display device PA1 may contact a second short side SS2 of the adjacent second display device PA2, and a first long side LS1 of the first display device PA1 may contact a third long side LS3 of the adjacent third display device PA3. A second long side LS2 of the second display device PA2 may contact a fourth long side LS4 of the adjacent fourth display device PA4, and a third short side SS3 of the third display device PA3 may contact a fourth short side SS4 of the adjacent fourth display device PA4.

In an embodiment, the tiled display device TD may include a boundary area BA in which at least one side of each of the display devices PA1, PA2, PA3, and PA4 is adjacent to a side of another display device and a main area MA which is an area other than the boundary area BA.

The boundary area BA may be an area where the long sides of the display devices PA1, PA2, PA3, and PA4 are adjacent to each other and an area where the short sides of the display devices PA1, PA2, PA3, and PA4 are adjacent to each other. For example, the boundary area BA may include an area where the first long side LS1 of the first display device PA1 and the third long side LS3 of the third display device PA3 are adjacent to each other, an area where the second long side LS2 of the second display device PA2 and the fourth long side LS4 of the fourth display device PA4 are adjacent to each other, an area where the first short side SS1 of the first display device PA1 and the second short side SS2 of the second display device PA2 are adjacent to each other, and an area where the third short side SS3 of the third display device PA3 and the fourth short side SS4 of the fourth display device PA4 are adjacent to each other.

The boundary area BA may extend in the first direction (X-axis direction) between the first display device PA1 and the third display device PA3 and between the second display device PA2 and the fourth display device PA4. Further, the boundary area BA may extend in the second direction (Y-axis direction) between the first display device PA1 and the second display device PA2 and between the third display device PA3 and the fourth display device PA4.

The main area MA may be an area excluding the boundary area BA from the display devices PA1, PA2, PA3, and PA4. The main area MA is an area where most of the pixels PX are disposed in the display devices PA1, PA2, PA3, and PA4 and may occupy most of the area of the tiled display device TD. The main area MA may include a plurality of main areas and may include a first main area MA1 disposed in the first display device PA1, a second main area MA2 disposed in the second display device PA2, a third main area MA3 disposed in the third display device PA3, and a fourth main area MA4 disposed in the fourth display device PA4. The main areas MA may be spaced from each other with the boundary area BA interposed between them. For example, the first main area MA1 of the first display device PA1 may be spaced in the first direction (X-axis direction) from the second main area MA2 of the second display device PA2 with the boundary area BA interposed between them. The first main area MA1 of the first display device PA1 may be spaced in the second direction (Y-axis direction) from the third main area MA3 of the third display device PA3 with the boundary area BA interposed between them. The third main area MA3 of the third display device PA3 may be spaced in the first direction (X-axis direction) from the fourth main area MA4 of the fourth display device PA4 with the boundary area BA interposed between them.

Each of the display devices PA1, PA2, PA3, and PA4 may display an image by including a plurality of pixels PX, each including a plurality of sub pixels SP. In order for the display devices PA1, PA2, PA3 and PA4 to display a seamless combined image, the pixels PX need to be aligned in the first direction (X-axis direction) and the second direction (Y-axis direction). When the display devices PA1, PA2, PA3, and PA4 are misaligned in the first direction (X-axis direction) or the second direction (Y-axis direction), the arrangement of the pixels PX may be distorted in the boundary area BA, causing boundaries to be visible.

In an embodiment, sub pixel configuration may be different in the main area MA and the boundary area BA to improve the problem of the boundaries of the tiled display device TD being seen.

Referring to FIG. 8 in conjunction with FIG. 7, the main area MA may include a plurality of first pixels PX1. The first pixels PX1 may be arranged in a matrix shape composed of a plurality of rows and a plurality of columns. Each of the first pixels PX1 may include a plurality of sub pixels SP emitting light of different colors and disposed adjacent to each other. The sub pixels SP may include a first sub pixel SP1, a second sub pixel SP2, and a third sub pixel SP3. The sub pixels SP may have the same size. However, the present disclosure is not limited thereto, and the sub pixels SP may also have different sizes.

Referring to FIG. 9 in conjunction with FIG. 7, the boundary area BA may include a plurality of second pixels PX2. The second pixels PX2 may be disposed in two rows or two columns. The second pixels PX2 may be disposed in two rows in an area where the long sides of the display devices PA1, PA2, PA3, and PA4 are adjacent to each other and may be disposed in two columns in an area where the short sides of the display devices PA1, PA2, PA3, and PA4 are disposed adjacent to each other. For example, the second pixels PX2 may be disposed in a total of two rows including one row formed by a plurality of second pixels PX2 of the first display device PA1 and one row formed by a plurality of second pixels PX2 of the third display device PA3. Further, the second pixels PX2 may be disposed in a total of two rows including one row formed by a plurality of second pixels PX2 of the second display device PA2 and one row formed by a plurality of second pixels PX2 of the fourth display device PA4. However, the present disclosure is not limited thereto, and the second pixels PX2 may also be disposed in three or more rows.

In some embodiments, the second pixels PX2 may be disposed in a total of two columns including one column formed by a plurality of second pixels PX2 of the first display device PA1 and one column formed by a plurality of second pixels PX2 of the second display device PA2. The second pixels PX2 may be disposed in a total of two columns including one column formed by a plurality of second pixels PX2 of the third display device PA3 and one column formed by a plurality of second pixels PX2 of the fourth display device PA4. However, the present disclosure is not limited thereto, and the second pixels PX2 may also be disposed in three or more columns.

Each of the second pixels PX2, like the first pixels PX1 described above, may include a plurality of sub pixels SP emitting light of different colors and disposed adjacent to each other. The sub pixels SP may include a first sub pixel SP1, a second sub pixel SP2, and a third sub pixel SP3. The sub pixels SP may have the same size and/or shape. However, the present disclosure is not limited thereto, and the sub pixels SP may also have different sizes and/or the same shape.

Each of the sub pixels SP included in each second pixel PX2, unlike those in each first pixel PX1, may be divided into a plurality of partial pixels PSP. The partial pixels PSP may emit light of the same color. For example, the partial pixels PSP of the first sub pixel SP1 may all emit light of the first color, the partial pixels PSP of the second sub pixel SP2 may all emit light of the second color, and the partial pixels PSP of the third sub pixel SP3 may all emit light of the third color.

The first sub pixel SP1, the second sub pixel SP2, and the third sub pixel SP3 may have the same shape. The first sub pixel SP1 will be described in detail below as an example.

The first sub pixel SP1 may include a first partial pixel PSP1, a second partial pixel PSP2, a third partial pixel PSP3, and a fourth partial pixel PSP4 disposed adjacent to each other. The first partial pixel PSP1 and the second partial pixel PSP2 may be disposed adjacent to each other in a short-axis direction, i.e., the first direction (X-axis direction) of the first sub pixel SP1 but may be spaced from each other. The first partial pixel PSP1 and the second partial pixel PSP2 may have substantially the same size and shape. A length L1 of each long side of each of the first partial pixel PSP1 and the second partial pixel PSP2 may be equal to a length L2 (see FIG. 8) of each long side of the first sub pixel SP1 of each first pixel PX1 described above. A distance L3 from a first side (e.g., a first long side) of the first partial pixel PSP1 to a second side (e.g., a second long side) of the second partial pixel PSP2 may be equal to a length L4 (see FIG. 8) of each short side of the first sub pixel SP1 of each first pixel PX1 described above. That is, the first partial pixel PSP1 and the second partial pixel PSP2 of the first sub pixel SP1 of each second pixel PX2 may have sizes into which the first sub pixel SP1 of each first pixel PX1 is divided.

The third partial pixel PSP3 may be disposed on a side of the first partial pixel PSP1 or the second partial pixel PSP2 in a long-axis direction, i.e., the second direction (Y-axis direction) of the first sub pixel SP1. The fourth partial pixel PSP4 may be disposed on the other side of the first partial pixel PSP1 or the second partial pixel PSP2 in a direction opposite to the long-axis direction, i.e., the second direction (Y-axis direction) of the first sub pixel SP1. That is, the third partial pixel PSP3 and the fourth partial pixel PSP4 may be spaced from each other with the first partial pixel PSP1 and the second partial pixel PSP2 interposed between them. A direction in which long sides of each of the third partial pixel PSP3 and the fourth partial pixel PSP4 extend may be parallel to a direction in which short sides of the first partial pixel PSP1 or the second partial pixel PSP2 extend. That is, the direction in which the long sides of each of the third partial pixel PSP3 and the fourth partial pixel PSP4 extend may be the first direction (X-axis direction).

The third partial pixel PSP3 and the fourth partial pixel PSP4 may have substantially the same size and shape. A length L5 of each long side of each of the third partial pixel PSP3 and the fourth partial pixel PSP4 may be equal to the length L4 (see FIG. 8) of each short side of the first sub pixel SP1 of each first pixel PX1 described above. The length L5 of each long side of each of the third partial pixel PSP3 and the fourth partial pixel PSP4 may be equal to the distance L3 from the first side of the first partial pixel PSP1 to the second side of the second partial pixel PSP2. A length L6 of each short side of each of the third partial pixel PSP3 and the fourth partial pixel PSP4 may be smaller than the length L1 of each long side of the first partial pixel PSP1. The length L6 of each short side of each of the third partial pixel PSP3 and the fourth partial pixel PSP4 may be related to a distance by which the alignment tolerance and misalignment of each of the display devices PA1, PA2, PA3, and PA4 are visible to a user. For example, the length L6 of each short side of each of the third partial pixel PSP3 and the fourth partial pixel PSP4 may be a value obtained by subtracting a distance by which misalignment is visible to a user from an alignment tolerance distance of each of the display devices PA1, PA2, PA3, and PA4.

According to the sub pixels SP described above, the sub pixels SP of each second pixel PX2 may be larger in size than the sub pixels SP of each first pixel PX1. Further, each of the first partial pixel PSP1 and the second partial pixel PSP2 may be larger in size than each of the third partial pixel PSP3 and the fourth partial pixel PSP4.

The sub pixels SP of each second pixel PX2 may be divided into smaller sizes that emit light individually. Because the sub pixels SP of each second pixel PX2 are larger in size than the sub pixels SP of each first sub pixel PX1, a driving circuit for driving each sub pixel SP of each first pixel PX1 may be relatively complicated. The partial pixels PSP included in each sub pixel SP of each second pixel PX2 may be driven individually because their driving circuits are simple. For example, each partial pixel PSP may be driven only by a driving transistor without a switching transistor and/or a sensing transistor. The driving transistor may emit light in response to a turn-on/turn-off signal transmitted to a gate electrode of the driving transistor through a scan line and a driving current of a light emitting diode supplied through a power line.

An operation when the display devices of the tiled display device TD according to the embodiment are aligned normally and an operation for compensating for misalignment when the display devices are misaligned will now be described.

Figure 10:
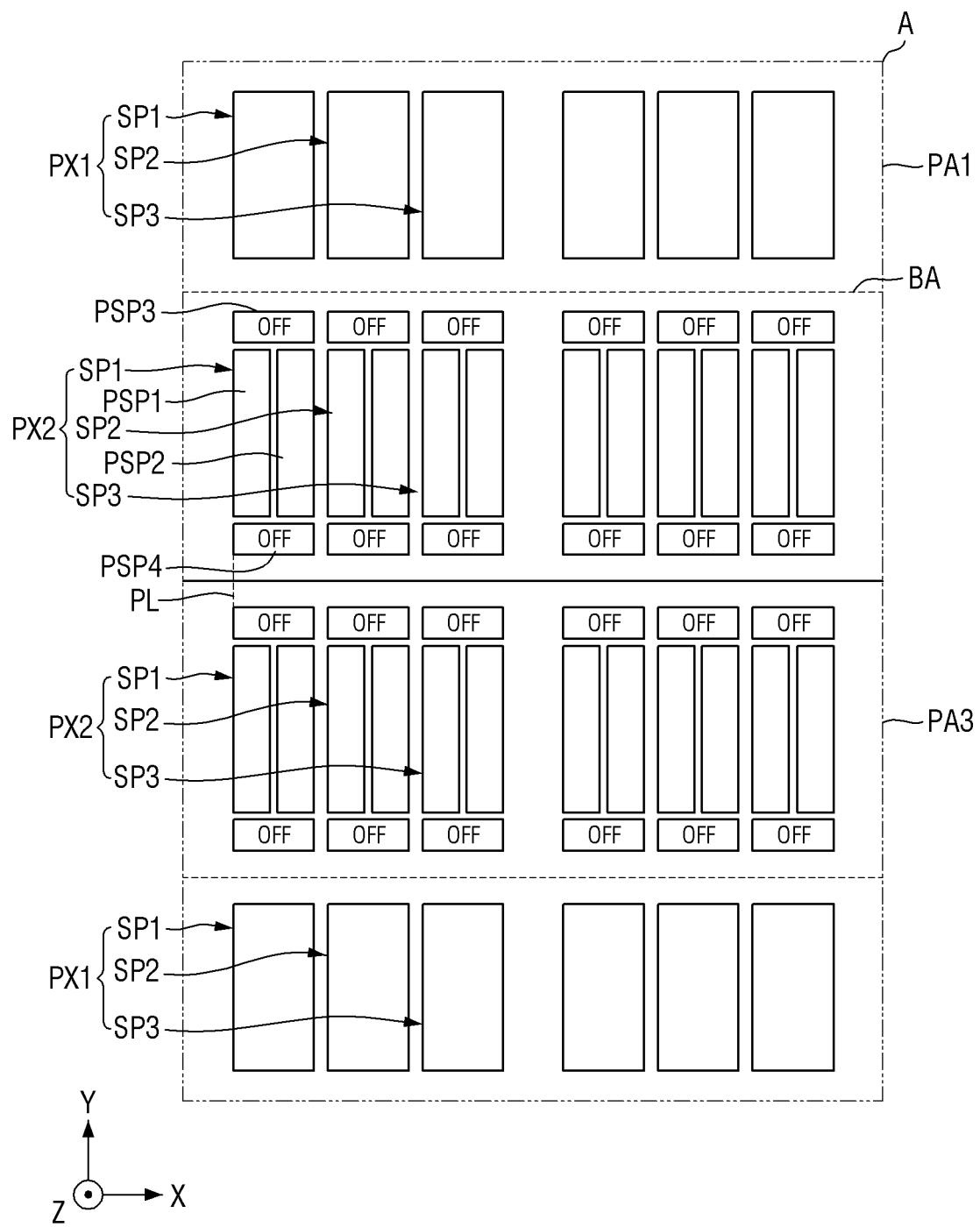
FIG. 10 is a schematic enlarged view of area A of FIG. 7.

FIG. 10 is a schematic enlarged view of area A of FIG. 7. FIG. 10 illustrates a case where the alignment of the first display device PA1 and the third display device PA3 in the first direction (X-axis direction) is normal. Further, in the following embodiments, a case where the pixels PX emit white light will be described as an example.

Referring to FIG. 10, the first display device PA1 and the third display device PA3 may be aligned in the first direction (X-axis direction). The first display device PA1 and the third display device PA3 may be aligned normally. Here, "aligned normally" means that the second pixels PX2 of the first display device PA1 and the second pixels PX2 of the third display device PA3 are not misaligned in the first direction (X-axis direction) in the boundary area BA. For example, a side of each second pixel PX2 of the first display device PA1 and a side of each second pixel PX2 of the third display device PA3 may coincide with an arbitrary imaginary line PL extending in the second direction (Y-axis direction).

When the first display device PA1 and the third display device PA3 are aligned in the first direction (X-axis direction), only at least a part of each of the second pixels PX2 of the first display device PA1 and the second pixels PX2 of the third display device PA3 may emit light.

For example, the second pixels PX2 of the first and third display devices PA1 and PA3 may have a larger area than the first pixels PX1 as described above. When both the first pixels PX1 and the second pixels PX2 of the first and third display devices PA1 and PA3 emit light, there may occur a difference in luminance between them because the emission area of each second pixel PX2 is larger compared to the emission area of the first pixels PX1.

In an embodiment, in each of the sub pixels SP of the second pixels PX2 of the first and third display devices PA1 and PA3, the first partial pixel PSP1 and the second partial pixel PSP2 may emit light, and the third partial pixel PSP3 and the fourth partial pixel PSP4 may not emit light. In the drawing, partial pixels that do not emit light are marked 'OFF.'

The area of each of the first partial pixel PSP1 and the second partial pixel PSP2 of the first sub pixel SP1 of each second pixel PX2 may be smaller than the area of the first sub pixel SP1 of each first pixel PX1. The sum of the areas of the first partial pixel PSP1 and the second partial pixel PSP2 of each second pixel PX2 may be smaller than the area of the first sub pixel SP1 of each first pixel PX1 due to a gap between the first partial pixel PSP1 and the second partial pixel PSP2 of each second pixel PX2. However, the sum of the areas of the first partial pixel PSP1 and the second partial pixel PSP2 of each second pixel PX2 may be similar to the area of the first sub pixel SP1 of each first pixel PX1. Therefore, the emission area of the first sub pixel SP1 of each first pixel PX1 may be similar to the collective emission area of the first partial pixel PSP1 and the second partial pixel PSP2 of the first sub pixel SP1 of each second pixel PX2. Accordingly, this may substantially reduce the difference in luminance between the first pixels PX1 and the second pixels PX2 in the boundary area BA between the first display device PA1 and the third display device PA3, thus making the tiled display device TD recognized as a single integrated tiled display device TD by a user.

Figure 11:
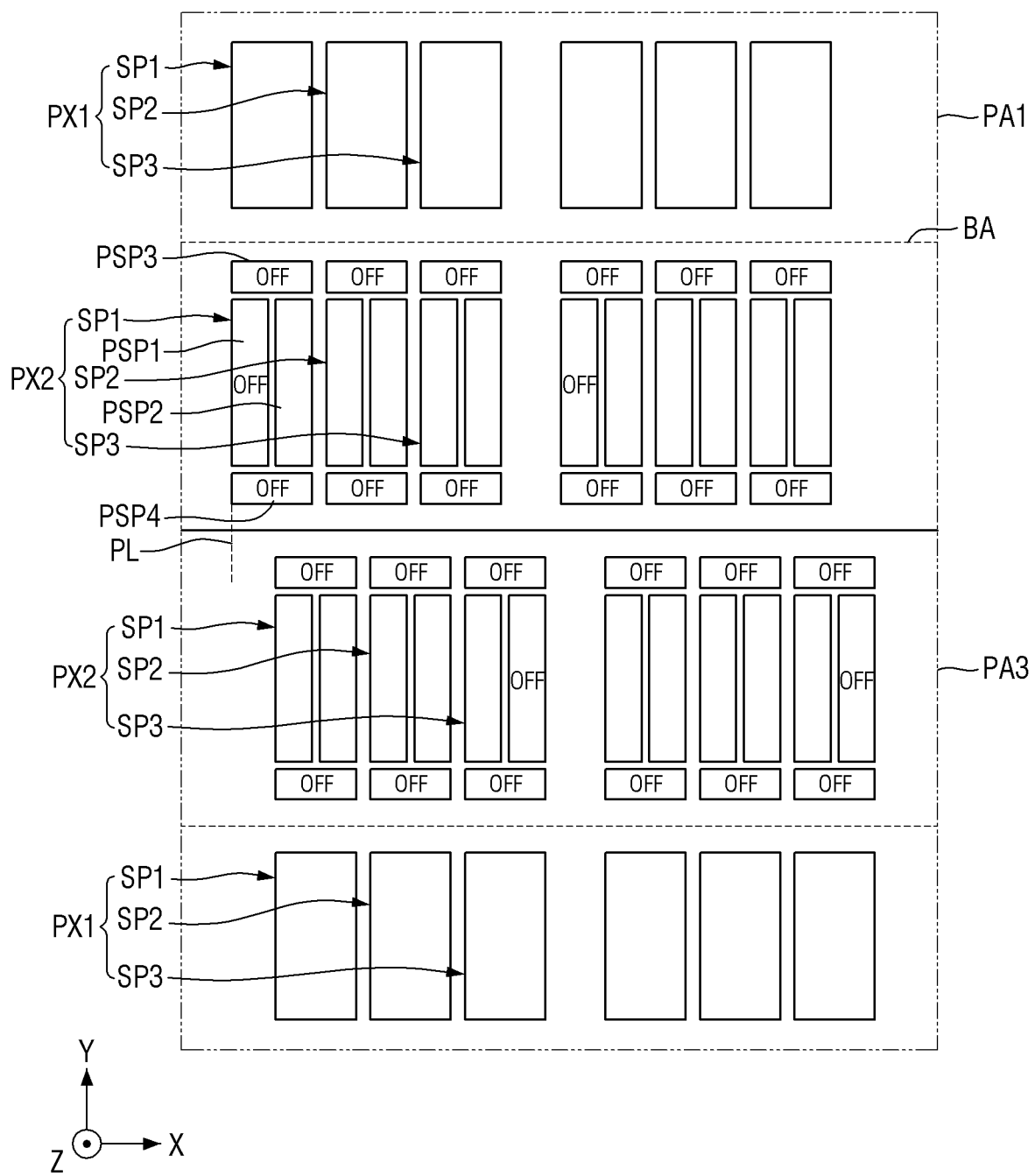
FIG. 11 is a schematic enlarged view of an example of area A of FIG. 7.
Figure 12:
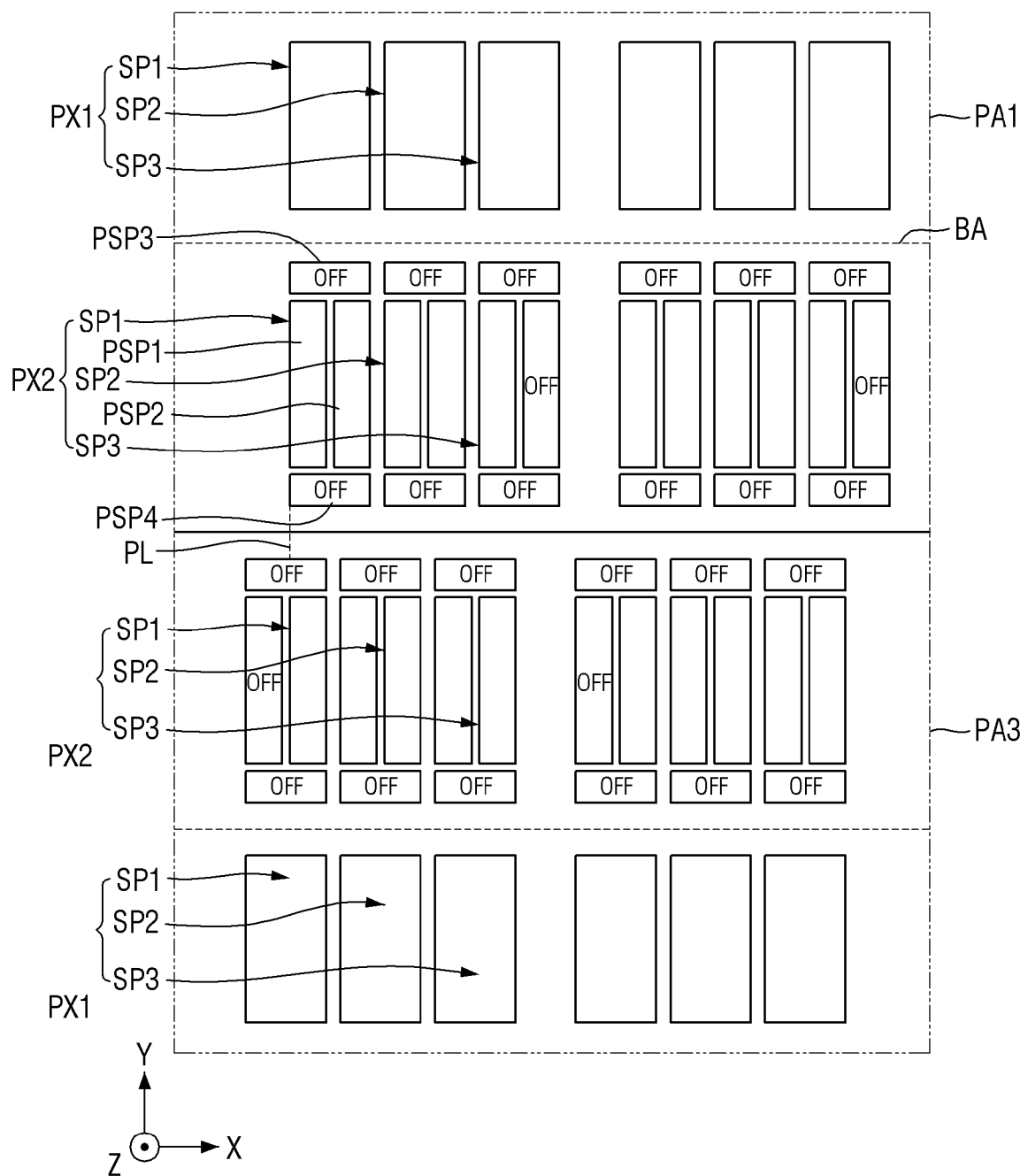
FIG. 12 is a schematic enlarged view of another example of area A of FIG. 7.

FIG. 11 is a schematic enlarged view of an example of area A of FIG. 7. FIG. 12 is a schematic enlarged view of another example of area A of FIG. 7. FIG. 11 illustrates a case where the first display device PA1 and the third display device PA3 are misaligned (e.g., be offset with each other) in the first direction (X-axis direction), and FIG. 12 illustrates a case where the first display device PA1 and the third display device PA3 are misaligned (e.g., be offset with each other) in a direction opposite to the first direction (X-axis direction). In other words, the pixels of the first display device PA1 and the pixels of the third display device PA3 are not aligned with each other along the Y-axis direction.

Referring to FIG. 11, the first display device PA1 and the third display device PA3 may be misaligned in the first direction (X-axis direction). Here, "misaligned" means that the second pixels PX2 of the third display device PA3 are moved in the first direction (X-axis direction) or the direction opposite to the first direction with respect to the second pixels PX2 of the first display device PA1 in the boundary area BA. For example, a side of each second pixel PX2 of the first display device PA1 and a side of each second pixel PX2 of the third display device PA3 may be misaligned or may not coincide with the arbitrary imaginary line PL extending in the second direction (Y-axis direction).

When the first display device PA1 and the third display device PA3 are misaligned in the first direction (X-axis direction), only at least a part of each of the second pixels PX2 of the first display device PA1 and the second pixels PX2 of the third display device PA3 may emit light.

In an embodiment, the second partial pixel PSP2 of the first sub pixel SP1 of each second pixel PX2 of the first display device PA1 may emit light, and the first partial pixel PSP1, the third partial pixel PSP3 and the fourth partial pixel PSP4 may not emit light. Further, in each of the second sub pixel SP2 and the third sub pixel SP3 of the first display device PA1, the first partial pixel PSP1 and the second partial pixel PSP2 may emit light, and the third partial pixel PSP3 and the fourth partial pixel PSP4 may not emit light.

Because the third display device PA3 is misaligned with the first display device PA1 in the first direction (X-axis direction), the first pixels PX1 and the second pixels PX2 of the third display device PA3 may also be misaligned with the first pixels PX1 and the second pixels PX2 of the first display device PA1 in the first direction (X-axis direction). In this case, a user may recognize the boundary area BA between the first display device PA1 and the third display device PA3 as being bent.

In an embodiment, in the first sub pixel SP1 of each second pixel PX2 of the first display device PA1, the second partial pixel PSP2 may emit light, and the first partial pixel PSP1, the third partial pixel PSP3, and the fourth partial pixel PSP4 may not emit light. In this case, the emission area of each second pixel PX2 may be smaller than the emission area of each first pixel PX1 by the first partial pixel PSP1 and thus may be moved in the first direction (X-axis direction) by the first partial pixel PSP1. That is, when the first pixels PX1 and the second pixels PX2 emit light in the first display device PA1, the emission area of each second pixel PX2 may be slightly moved in the first direction (X-axis direction).

Further, in each of the first sub pixel SP1 and the second sub pixel SP2 of each second pixel PX2 of the third display device PA3, the first partial pixel PSP1 and the second partial pixel PSP2 may emit light, and the third partial pixel PSP3 and the fourth partial pixel PSP4 may not emit light. In the third sub pixel SP3, the first partial pixel PSP1 may emit light, and the second partial pixel PSP2, the third partial pixel PSP2, and the fourth partial pixel PSP4 may not emit light.

In an embodiment, in the third sub pixel SP3 of each second pixel PX2 of the third display device PA3, the first partial pixel PSP1 may emit light, and the second partial pixel PSP2, the third partial pixel PSP3, and the fourth partial pixel PSP4 may not emit light. In this case, the emission area of each second pixel PX2 may be smaller than the emission area of each first pixel PX1 by the second partial pixel PSP2 and thus may be moved in the direction opposite to the first direction (X-axis direction) by the second partial pixel PSP2. That is, when the first pixels PX1 and the second pixels PX2 emit light in the third display device PA3, the emission area of each second pixel PX2 may be slightly moved in the direction opposite to the first direction (X-axis direction).

Consequently, in the boundary area BA, the emission area of each second pixel PX2 of the first display device PA1 may be slightly moved in the first direction (X-axis direction), and the emission area of each second pixel PX2 of the third display device PA3 may be slightly moved in the direction opposite to the first direction (X-axis direction). Therefore, when the second pixels PX2 of the first display device PA1 and the second pixels PX2 of the third display device PA3 emit white light, the problem of misalignment in the boundary area BA being recognized by a user can be improved.

Referring to FIG. 12, in another example, the first display device PA1 and the third display device PA3 may be misaligned in the direction opposite to the first direction (X-axis direction). When the first display device PA1 and the third display device PA3 are misaligned in the direction opposite to the first direction (X-axis direction), only at least a part of each of the second pixels PX2 of the first display device PA1 and the second pixels PX2 of the third display device PA3 may emit light.

In an embodiment, the first partial pixel PSP1 of the third sub pixel SP3 of each second pixel PX2 of the first display device PA1 may emit light, and the second partial pixel PSP2, the third partial pixel PSP3, and the fourth partial pixel PSP4 may not emit light. Further, in each of the first sub pixel SP1 and the second sub pixel SP2 of each second pixel PX2 of the first display device PA1, the first partial pixel PSP1 and the second partial pixel PSP2 may emit light, and the third partial pixel PSP3 and the fourth partial pixel PSP4 may not emit light.

Because the third display device PA3 is misaligned with the first display device PA1 in the direction opposite to the first direction (X-axis direction), the first pixels PX1 and the second pixels PX2 of the third display device PA3 may also be misaligned with the first pixels PX1 and the second pixels PX2 of the first display device PA1 in the direction opposite to the first direction (X-axis direction). In this case, a user may recognize the boundary area BA between the first display device PA1 and the third display device PA3 as being bent.

In an embodiment, in the third sub pixel SP3 of each second pixel PX2 of the first display device PA1, the first partial pixel PSP1 may emit light, and the second partial pixel PSP2, the third partial pixel PSP3, and the fourth partial pixel PSP4 may not emit light. In this case, the emission area of each second pixel PX2 may be smaller than the emission area of each first pixel PX1 of the first display device PA1 by the second partial pixel PSP2 and thus may be moved in the direction opposite to the first direction (X-axis direction) by the second partial pixel PSP2. That is, when the first pixels PX1 and the second pixels PX2 emit light in the first display device PA1, the emission area of each second pixel PX2 may be slightly moved in the direction opposite to the first direction (X-axis direction).

Further, in the first sub pixel SP1 of each second pixel PX2 of the third display device PA3, the second partial pixel PSP2 may emit light, and the first partial pixel PSP1, the third partial pixel PSP3, and the fourth partial pixel PSP4 may not emit light. In each of the second sub pixel SP2 and the third sub pixel SP3, the first partial pixel PSP1 and the second partial pixel PSP2 may emit light, and the third partial pixel PSP3 and the fourth partial pixel PSP4 may not emit light.

In an embodiment, in the first sub pixel SP1 of each second pixel PX2 of the third display device PA3, the second partial pixel PSP2 may emit light, and the first partial pixel PSP1, the third partial pixel PSP3, and the fourth partial pixel PSP4 may not emit light. In this case, the emission area of each second pixel PX2 may be smaller than the emission area of each first pixel PX1 of the third display device PA3 by the first partial pixel PSP1 and thus may be moved in the first direction (X-axis direction) by the first partial pixel PSP1. That is, when the first pixels PX1 and the second pixels PX2 emit light in the third display device PA3, the emission area of each second pixel PX2 may be slightly moved in the first direction (X-axis direction).

Consequently, in the boundary area BA, the emission area of each second pixel PX2 of the first display device PA1 may be slightly moved in the direction opposite to the first direction (X-axis direction), and the emission area of each second pixel PX2 of the third display device PA3 may be slightly moved in the first direction (X-axis direction). Therefore, when the second pixels PX2 of the first display device PA1 and the second pixels PX2 of the third display device PA3 emit white light, the problem of misalignment in the boundary area BA being recognized by a user can be improved.

Figure 13:
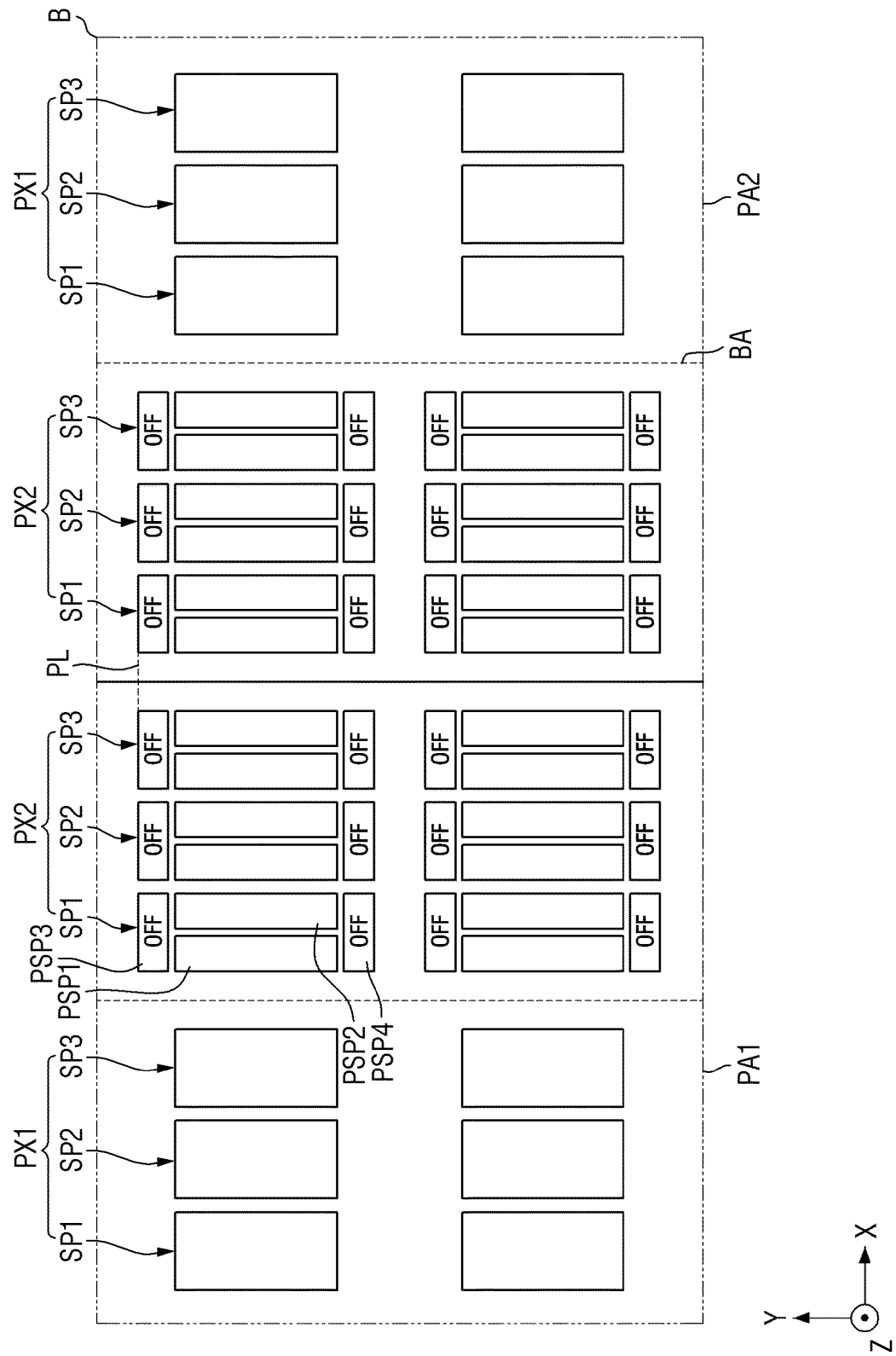
FIG. 13 is a schematic enlarged view of area B of FIG. 7.

FIG. 13 is a schematic enlarged view of area B of FIG. 7. FIG. 13 illustrates a case where the alignment of the first display device PA1 and the second display device PA2 in the second direction (Y-axis direction) is normal.

Referring to FIG. 13, the first display device PA1 and the second display device PA2 may be aligned in the second direction (Y-axis direction). In the boundary area BA between the first display device PA1 and the second display device PA2, the second pixels PX2 of the first display device PA1 and the second pixels PX2 of the second display device PA2 may be aligned in the second direction (Y-axis direction) without distortion. For example, a side of each second pixel PX2 of the first display device PA1 and a side of each second pixel PX2 of the second display device PA2 may coincide with an arbitrary imaginary line PL extending in the first direction (X-axis direction).

When the first display device PA1 and the second display device PA2 are aligned in the second direction (Y-axis direction), only at least a part of each of the second pixels PX2 of the first display device PA1 and the second pixels PX2 of the second display device PA2 may emit light.

For example, the second pixels PX2 of the first and second display devices PA1 and PA2 may have a larger area than the first pixels PX1 as described above. When both the first pixels PX1 and the second pixels PX2 of the first and second display devices PA1 and PA2 emit light, there may occur a difference in luminance between them because the emission area of each second pixel PX2 is larger than the emission area of each of the first pixels PX1.

In an embodiment, in each of the sub pixels SP of the second pixels PX2 of the first and second display devices PA1 and PA2, the first partial pixel PSP1 and the second partial pixel PSP2 may emit light, and the third partial pixel PSP3 and the fourth partial pixel PSP4 may not emit light.

The area of each of the first partial pixel PSP1 and the second partial pixel PSP2 of the first sub pixel SP1 of each second pixel PX2 may be smaller than the area of the first sub pixel SP1 of each first pixel PX1. The sum of the areas of the first partial pixel PSP1 and the second partial pixel PSP2 of each second pixel PX2 may be smaller than the area of the first sub pixel SP1 of each first pixel PX1 due to a gap between the first partial pixel PSP1 and the second partial pixel PSP2 of each second pixel PX2. However, the sum of the areas of the first partial pixel PSP1 and the second partial pixel PSP2 of each second pixel PX2 may be similar to the area of the first sub pixel SP1 of each first pixel PX1. Therefore, the emission area of the first sub pixel SP1 of each first pixel PX1 may be similar to the collective emission area of the first partial pixel PSP1 and the second partial pixel PSP2 of the first sub pixel SP1 of each second pixel PX2. Accordingly, this may reduce the difference in luminance between the first pixels PX1 and the second pixels PX2 in the boundary area BA between the first display device PA1 and the second display device PA2, thus making the tiled display device TD recognized as a single integrated tiled display device TD by a user.

Figure 14:
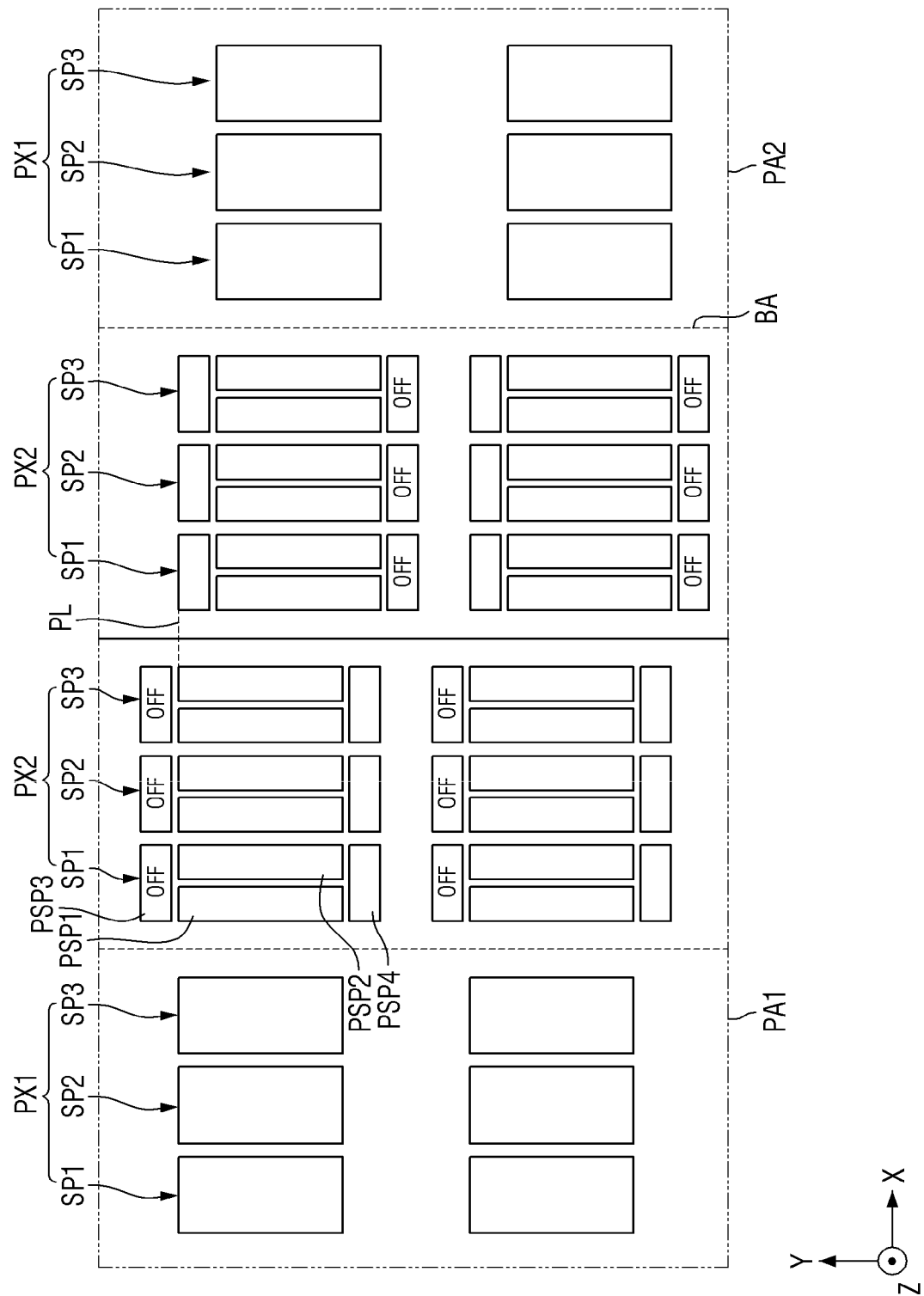
FIG. 14 is a schematic enlarged view of an example of area B of FIG. 7.
Figure 15:
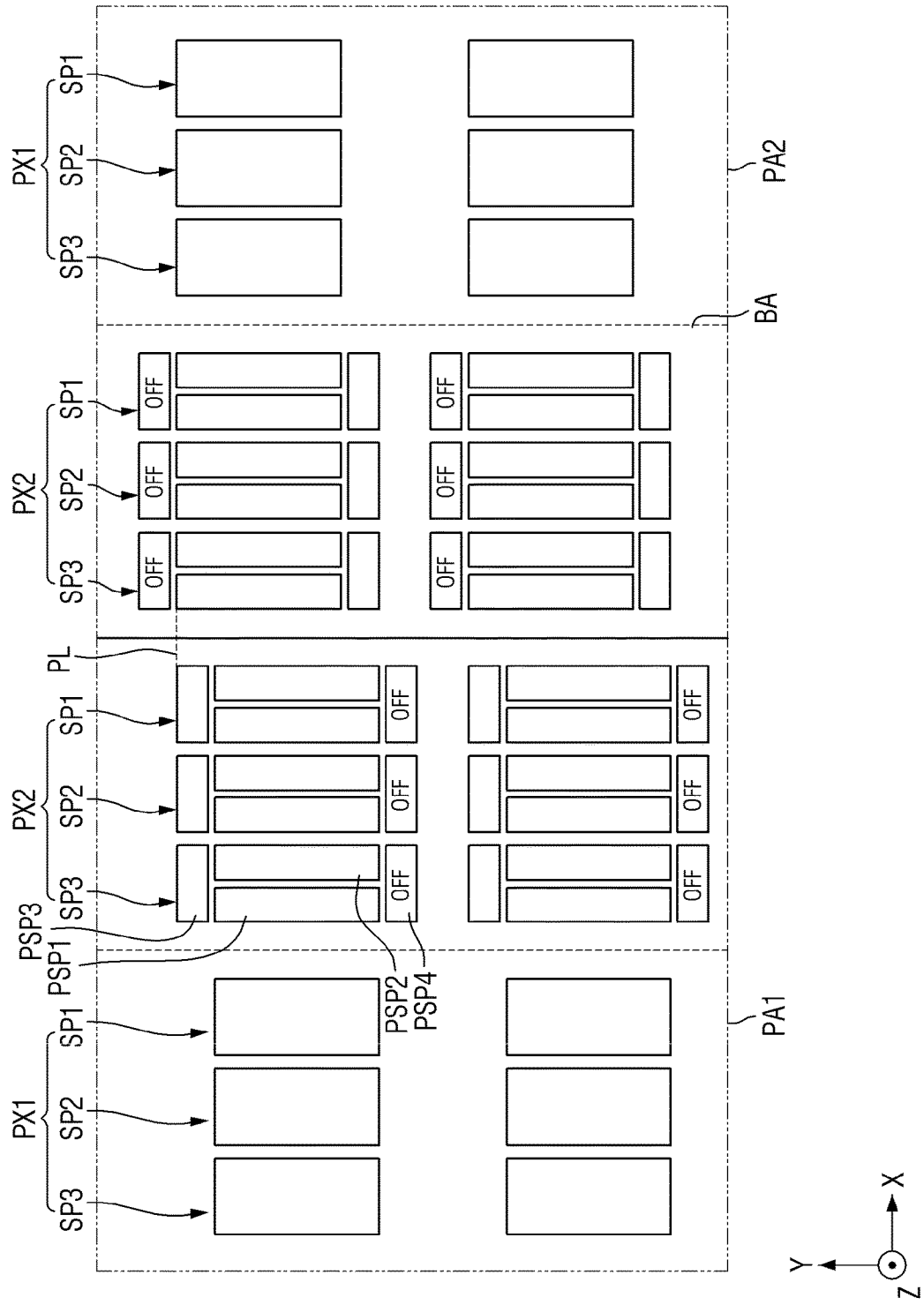
FIG. 15 is a schematic enlarged view of another example of area B of FIG. 7.

FIG. 14 is a schematic enlarged view of an example of area B of FIG. 7. FIG. 15 is a schematic enlarged view of another example of area B of FIG. 7. FIG. 14 illustrates a case where the second display device PA2 is misaligned (e.g., be offset) with the first display device PA1 in the direction opposite to the second direction (Y-axis direction), and FIG. 15 illustrates a case where the second display device PA2 is misaligned with the first display device PA1 in the second direction (Y-axis direction). In other words, the pixels of the first display device PA1 and the pixels of the second display device PA2 are not aligned with each other along the X-axis direction.

Referring to FIG. 14, the second display device PA2 may be misaligned with the first display device PA1 in the direction opposite to the second direction (Y-axis direction). Here, "misaligned" means that the second pixels PX2 of the second display device PA2 are moved in the second direction (Y-axis direction) or the direction opposite to the second direction with respect to the second pixels PX2 of the first display device PA1 in the boundary area BA. For example, a side of each second pixel PX2 of the first display device PA1 and a side of each second pixel PX2 of the second display device PA2 may not coincide with the arbitrary imaginary line PL extending in the first direction (X-axis direction).

When the second display device PA2 is misaligned with the first display device PA1 in the direction opposite to the second direction (Y-axis direction), only at least a part of each of the second pixels PX2 of the first display device PA1 and the second pixels PX2 of the second display device PA2 may emit light.

In an embodiment, the first partial pixel PSP1, the second partial pixel PSP2, and the fourth partial pixel PSP4 of each of the first to third sub pixels SP1, SP2, and SP3 of each second pixel PX2 of the first display device PA1 may emit light, and the third partial pixel PSP3 may not emit light.

Because the second display device PA2 is misaligned with the first display device PA1 in the direction opposite to the second direction (Y-axis direction), the first pixels PX1 and the second pixels PX2 of the second display device PA2 may also be misaligned with the first pixels PX1 and the second pixels PX2 of the first display device PA1 in the direction opposite to the second direction (Y-axis direction). In this case, a user may recognize the boundary area BA between the first display device PA1 and the second display device PA2 as being bent.

In an embodiment, in the first to third sub pixels SP1, SP2, and SP3 of each second pixel PX2 of the first display device PA1, the first partial pixel PSP1, the second partial pixel PSP2, and the fourth partial pixel PSP4 may emit light, and the third partial pixel PSP3 may not emit light. In this case, in the first display device PA1, the emission area of each second pixel PX2 may be larger than the emission area of each first pixel PX1 by the fourth partial pixel PSP4 and thus may be moved in the direction opposite to the second direction (Y-axis direction) by the fourth partial pixel PSP4. That is, when the first pixels PX1 and the second pixels PX2 emit light in the first display device PA1, the emission area of each second pixel PX2 may be slightly moved in the direction opposite to the second direction (Y-axis direction).

Further, in each of the first to third sub pixels SP1, SP2, and SP3 of each second pixel PX2 of the second display device PA2, the first partial pixel PSP1, the second partial pixel PSP2, and the third partial pixel PSP3 may emit light, and the fourth partial pixel PSP4 may not emit light.

In an embodiment, in each of the first to third sub pixels SP1, SP2, and SP3 of each second pixel PX2 of the second display device PA2, the first partial pixel PSP1, the second partial pixel PSP2, and the third partial pixel PSP3 may emit light, and the fourth partial pixel PSP4 may not emit light. In this case, in the second display device PA2, the emission area of each second pixel PX2 may be larger than the emission area of each first pixel PX1 by the third partial pixel PSP3 and thus may be moved in the second direction (Y-axis direction) by the third partial pixel PSP3. That is, when the first pixels PX1 and the second pixels PX2 emit light in the second display device PA2, the emission area of each second pixel PX2 may be slightly moved in the second direction (Y-axis direction).

Consequently, in the boundary area BA, the emission area of each second pixel PX2 of the first display device PA1 may be slightly moved in the direction opposite to the second direction (Y-axis direction), and the emission area of each second pixel PX2 of the second display device PA2 may be slightly moved in the second direction (Y-axis direction). Therefore, when the second pixels PX2 of the first display device PA1 and the second pixels PX2 of the second display device PA2 emit white light, the problem of misalignment in the boundary area BA being recognized by a user can be improved.

Referring to FIG. 15, in another example, the second display device PA2 may be misaligned with the first display device PA1 in the second direction (Y-axis direction). When the second display device PA2 is misaligned with the first display device PA1 in the second direction (Y-axis direction), only at least a part of each of the second pixels PX2 of the first display device PA1 and the second pixels PX2 of the second display device PA2 may emit light.

In an embodiment, the first partial pixel PSP1, the second partial pixel PSP2, and the third partial pixel PSP3 of each of the first to third sub pixels SP1, SP2, and SP3 of each second pixel PX2 of the first display device PA1 may emit light, and the fourth partial pixel PSP4 may not emit light.

Because the second display device PA2 is misaligned with the first display device PA1 in the second direction (Y-axis direction), the first pixels PX1 and the second pixels PX2 of the second display device PA2 may also be misaligned with the first pixels PX1 and the second pixels PX2 of the first display device PA1 in the second direction (Y-axis direction). In this case, a user may recognize the boundary area BA between the first display device PA1 and the second display device PA2 as being bent.

In an embodiment, in each of the first to third sub pixels SP1, SP2, and SP3 of each second pixel PX2 of the first display device PA1, the first partial pixel PSP1, the second partial pixel PSP2, and the third partial pixel PSP3 may emit light, and the fourth partial pixel PSP4 may not emit light. In this case, in the first display device PA1, the emission area of each second pixel PX2 may be larger than the emission area of each first pixel PX1 by the third partial pixel PSP3 and thus may be moved in the second direction (Y-axis direction) by the third partial pixel PSP3. That is, when the first pixels PX1 and the second pixels PX2 emit light in the first display device PA1, the emission area of each second pixel PX2 may be slightly moved in the second direction (Y-axis direction).

Further, in each of the first to third sub pixels SP1, SP2, and SP3 of each second pixel PX2 of the second display device PA2, the first partial pixel PSP1, the second partial pixel PSP2, and the fourth partial pixel PSP4 may emit light, and the third partial pixel PSP3 may not emit light.

In an embodiment, in each of the first to third sub pixels SP1, SP2, and SP3 of each second pixel PX2 of the second display device PA2, the first partial pixel PSP1, the second partial pixel PSP2, and the fourth sub pixel PSP4 may emit light, and the third partial pixel PSP3 may not emit light. In this case, in the second display device PA2, the emission area of each second pixel PX2 may be larger than the emission area of each first pixel PX1 by the fourth partial pixel PSP4 and thus may be moved in the direction opposite to the second direction (Y-axis direction) by the fourth partial pixel PSP4. That is, when the first pixels PX1 and the second pixels PX2 emit light in the second display device PA2, the emission area of each second pixel PX2 may be slightly moved in the direction opposite to the second direction (Y-axis direction).

Consequently, in the boundary area BA, the emission area of each second pixel PX2 of the first display device PA1 may be slightly moved in the second direction (Y-axis direction), and the emission area of each second pixel PX2 of the second display device PA2 may be slightly moved in the direction opposite to the second direction (Y-axis direction). Therefore, when the second pixels PX2 of the first display device PA1 and the second pixels PX2 of the second display device PA2 emit white light, the problem of misalignment in the boundary area BA being recognized by a user can be improved.

Figure 16:
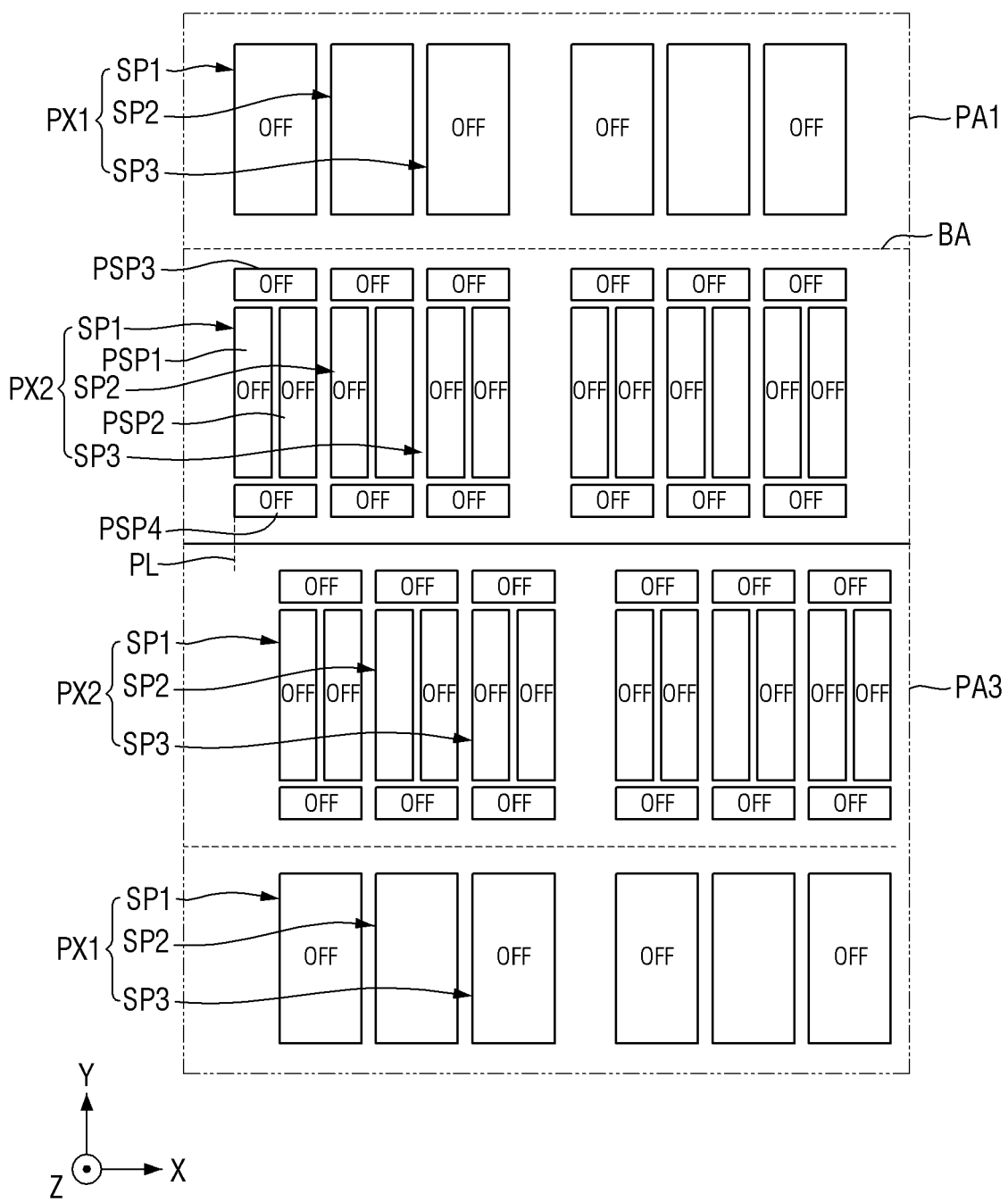
FIG. 16 is a schematic plan view of another embodiment of area A of FIG. 7.
Figure 17:
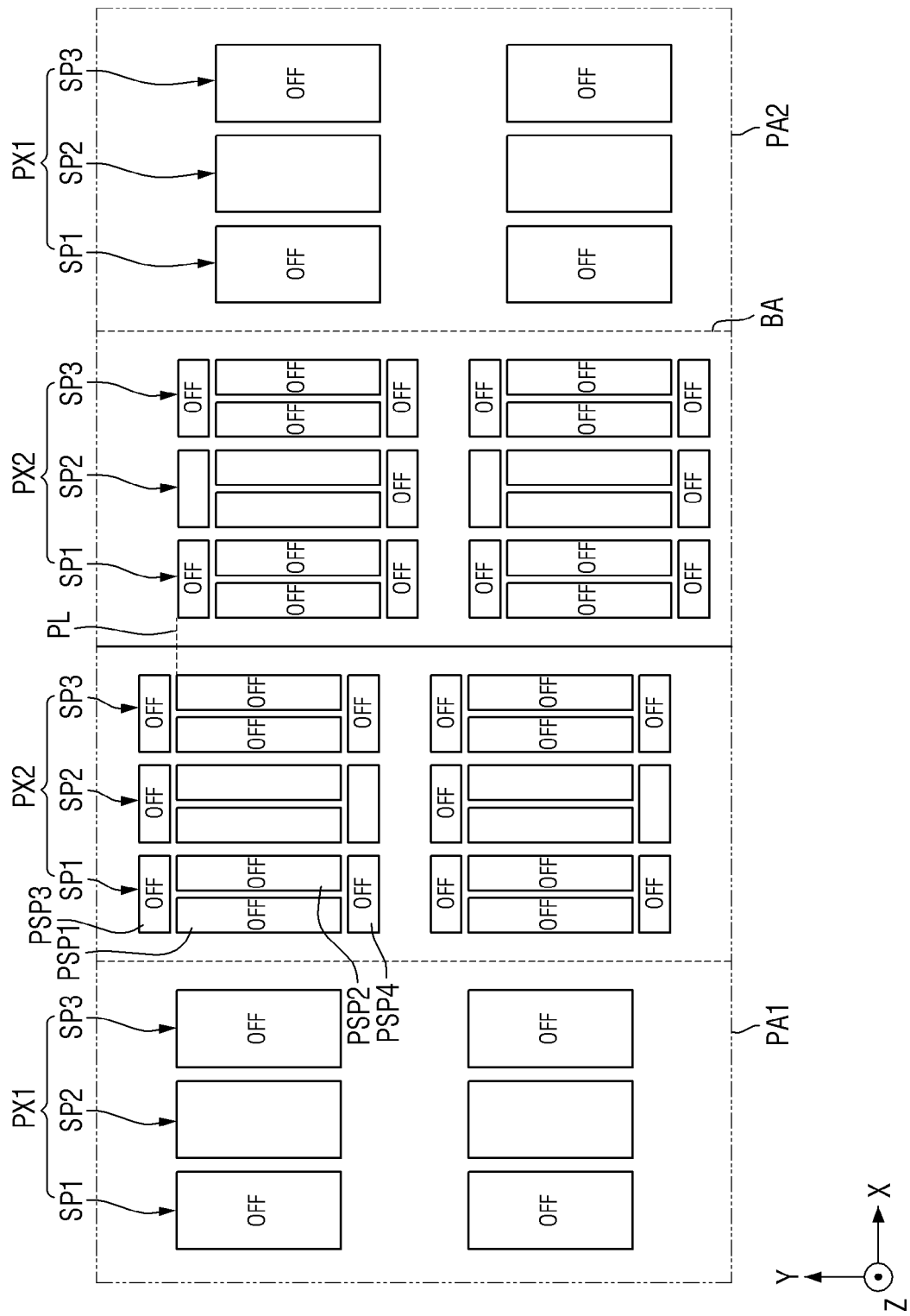
FIG. 17 is a schematic plan view of another embodiment of area B of FIG. 7.

FIG. 16 is a schematic plan view of another embodiment of area A of FIG. 7. FIG. 17 is a schematic plan view of another embodiment of area B of FIG. 7. FIGS. 16 and 17 are views for explaining a method of preventing the misalignment of display devices from being seen when one sub pixel representing a single color emits light.

Referring to FIG. 16, unlike in the previous embodiment in which the pixels PX described above emit white light, the operation of sub pixels for emitting green light in each pixel PX to emit light of a single color will be described below as an example.

Referring to FIG. 16, the first display device PA1 and the third display device PA3 may be misaligned (e.g., be offset with each other) in the first direction (X-axis direction). In other words, the pixels of the first display device PA1 and the pixels of the third display device PA3 are not aligned with each other along the Y-axis direction. When the first display device PA1 and the third display device PA3 are misaligned in the first direction (X-axis direction), only at least a part of each of the second pixels PX2 of the first display device PA1 and the second pixels PX2 of the third display device PA3 may emit light. A case where the second sub pixel SP2 of each pixel PX emits green light, the first sub pixel SP1 emits red light, and the third sub pixel SP3 emits blue light will be described below as an example.

In an embodiment, the second sub pixel SP2 of each of the first pixels PX1 of the first display device PA1 and the third display device PA3 may emit light, and the other first and third sub pixels SP1 and SP3 may not emit light, thereby realizing green color. Further, in the boundary area BA, the whole of the first sub pixel SP1 and the third sub pixel SP3 of each second pixel PX2 of the first display device PA1 may not emit light, while the second partial pixel PSP2 of the second sub pixel SP2 emits light, and the first partial pixel PSP1, the third partial pixel PSP3, and the fourth partial pixel PSP4 do not emit light.

Because the third display device PA3 is misaligned with the first display device PA1 in the first direction (X-axis direction), the first pixels PX1 and the second pixels PX2 of the third display device PA3 may also be misaligned with the first pixels PX1 and the second pixels PX2 of the first display device PA1 in the first direction (X-axis direction). In this case, a user may recognize the boundary area BA between the first display device PA1 and the third display device PA3 as being bent.

In an embodiment, in the second sub pixel SP2 of each second pixel PX2 of the first display device PA1, the second partial pixel PSP2 may emit light, and the first partial pixel PSP1, the third partial pixel PSP3, and the fourth partial pixel PSP4 may not emit light. In this case, in the first display device PA1, the emission area of the second sub pixel SP2 of each second pixel PX2 may be smaller than the emission area of the second sub pixel SP2 of each first pixel PX1 by the first partial pixel PSP1 and thus may be moved in the first direction (X-axis direction) by the first partial pixel PSP1. That is, when the second sub pixel SP2 of each first pixel PX1 and the second sub pixel SP2 of each second pixel PX2 emit green light in the first display device PA1, the emission area of the second sub pixel SP2 of each second pixel PX2 may be slightly moved in the first direction (X-axis direction).

Further, the whole of the first sub pixel SP1 and the third sub pixel SP3 of each second pixel PX2 of the third display device PA3 may not emit light, while the first partial pixel PSP1 of the second sub pixel SP2 emits light, and the second partial pixel PSP2, the third partial pixel PSP3, and the fourth partial pixel PSP4 do not emit light.

In an embodiment, in the second sub pixel SP2 of each second pixel PX2 of the third display device PA3, the first partial pixel PSP1 may emit light, and the second partial pixel PSP2, the third partial pixel PSP3, and the fourth partial pixel PSP4 may not emit light. In this case, in the third display device PA3, the emission area of the second sub pixel SP2 of each second pixel PX2 may be smaller than the emission area of the second sub pixel SP2 of each first pixel PX1 by the second partial pixel PSP2 and thus may be moved in the direction opposite to the first direction (X-axis direction) by the second partial pixel PSP2. That is, when the second sub pixel SP2 of each first pixel PX1 and the second sub pixel SP2 of each second pixel PX2 emit green light in the third display device PA3, the emission area of the second sub pixel SP2 of each second pixel PX2 may be slightly moved in the direction opposite to the first direction (X-axis direction).

Consequently, in the boundary area BA, the emission area of the second sub pixel SP2 of each second pixel PX2 of the first display device PA1 may be slightly moved in the first direction (X-axis direction), and the emission area of the second sub pixel SP2 of each second pixel PX2 of the third display device PA3 may be slightly moved in the direction opposite to the first direction (X-axis direction). Therefore, when the second sub pixel SP2 of each second pixel PX2 of the first display device PA1 and the second sub pixel SP2 of each second pixel PX2 of the third display device PA3 emit green light, the problem of misalignment in the boundary area BA being recognized by a user can be improved.

Referring to FIG. 17, in another example, the first display device PA1 and the second display device PA2 may be misaligned in the second direction (Y-axis direction). In other words, the pixels of the first display device PA1 and the pixels of the second display device PA2 are not aligned with each other along the X-axis direction. When the first display device PA1 and the second display device PA2 are misaligned in the second direction (Y-axis direction), only at least a part of each of the second sub pixel SP2 of each second pixel PX2 of the first display device PA1 and the second sub pixel SP2 of each second pixel PX2 of the second display device PA2 may emit light.

In an embodiment, the second sub pixel SP2 of each first pixel PX1 of the first display device PA1 may emit green light, and the first sub pixel SP1 and the third sub pixel SP3 may not emit light. Further, the first sub pixel SP1 and the third sub pixel SP3 of each second pixel PX2 of the first display device PA1 may not emit light, while the first partial pixel PSP1, the second partial pixel PSP2, and the fourth partial pixel PSP4 of the second sub pixel SP2 emit light, and the third partial pixel PSP3 does not emit light.

Because the second display device PA2 is misaligned with the first display device PA1 in the direction opposite to the second direction (Y-axis direction), the second sub pixel SP2 of each first pixel PX1 and the second sub pixel SP2 of each second pixel PX2 of the second display device PA2 may also be misaligned with the second sub pixel SP2 of each first pixel PX1 and the second sub pixel SP2 of each second pixel PX2 of the first display device PA1 in the direction opposite to the second direction (Y-axis direction). In this case, a user may recognize the boundary area BA between the first display device PA1 and the second display device PA2 as being bent.

In an embodiment, in the boundary area BA, the whole of the first and third sub pixels SP1 and SP3 of each second pixel PX2 of the first display device PA1 may not emit light, while the first partial pixel PSP1, the second partial pixel PSP2, and the fourth partial pixel PSP4 of the second sub pixel SP2 emit light, and the third partial pixel PSP3 does not emit light. In this case, in the first display device PA1, the emission area of the second sub pixel SP2 of each second pixel PX2 may be larger than the emission area of the second sub pixel SP2 of each first pixel PX1 by the fourth partial pixel PSP4 and thus may be moved in the direction opposite to the second direction (Y-axis direction) by the fourth partial pixel PSP4. That is, when the second sub pixel SP2 of each first pixel PX1 and the second sub pixel SP2 of each second pixel PX2 emit light in the first display device PA1, the emission area of the second sub pixel SP2 of each second pixel PX2 may be slightly moved in the direction opposite to the second direction (Y-axis direction).

Further, the whole of the first and third sub pixels SP1 and SP3 of each second pixel PX2 of the second display device PA2 may not emit light, while the first partial pixel PSP1, the second partial pixel PSP2, and the third partial pixel PSP3 of the second sub pixel SP2 emit light, and the fourth partial pixel PSP4 does not emit light.

In an embodiment, in the second sub pixel SP2 of each second pixel PX2 of the second display device PA2, the first partial pixel PSP1, the second partial pixel PSP2, and the third partial pixel PSP3 may emit light, and the fourth partial pixel PSP4 may not emit light. In this case, in the second display device PA2, the emission area of the second sub pixel SP2 of each second pixel PX2 may be larger than the emission area of the second sub pixel SP2 of each first pixel PX1 by the third partial pixel PSP3 and thus may be moved in the second direction (Y-axis direction) by the third partial pixel PSP3. That is, when the second sub pixel SP2 of each first pixel PX1 and the second sub pixel SP2 of each second pixel PX2 emit light in the second display device PA2, the emission area of the second sub pixel SP2 of each second pixel PX2 may be slightly moved in the second direction (Y-axis direction).

Consequently, in the boundary area BA, the emission area of the second sub pixel SP2 of each second pixel PX2 of the first display device PA1 may be slightly moved in the direction opposite to the second direction (Y-axis direction), and the emission area of the second sub pixel SP2 of each second pixel PX2 of the second display device PA2 may be slightly moved in the second direction (Y-axis direction). Therefore, when the second sub pixel SP2 of each second pixel PX2 of the first display device PA1 and the second sub pixel SP2 of each second pixel PX2 of the second display device PA2 emit green light, the problem of misalignment in the boundary area BA being recognized by a user can be improved.

Although the operation of the second sub pixel SP2 that emits green light is described in the embodiment of FIGS. 16 and 17, the operation of the first sub pixel SP1 that emits red light and the operation of the third sub pixel SP3 that emits blue light may also be the same as the operation of the second sub pixel SP2. Further, when the first display device PA1 is correctly aligned with the third display device PA3 and the second display device PA2, the third partial pixel PSP3 and the fourth partial pixel PSP4 of each sub pixel SP may not emit light, and the first partial pixel PSP1 and the second partial pixel PSP2 may emit light.

Figure 18:
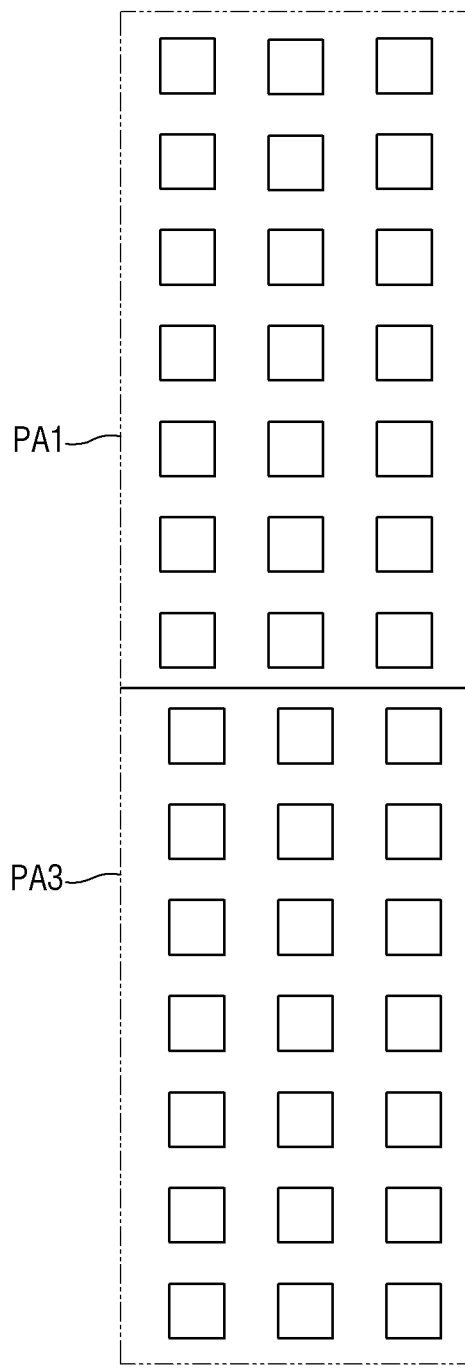
FIG. 18 is a schematic plan view illustrating a case where each pixel of a tiled display device according to a comparative example emits white light.
Figure 19:
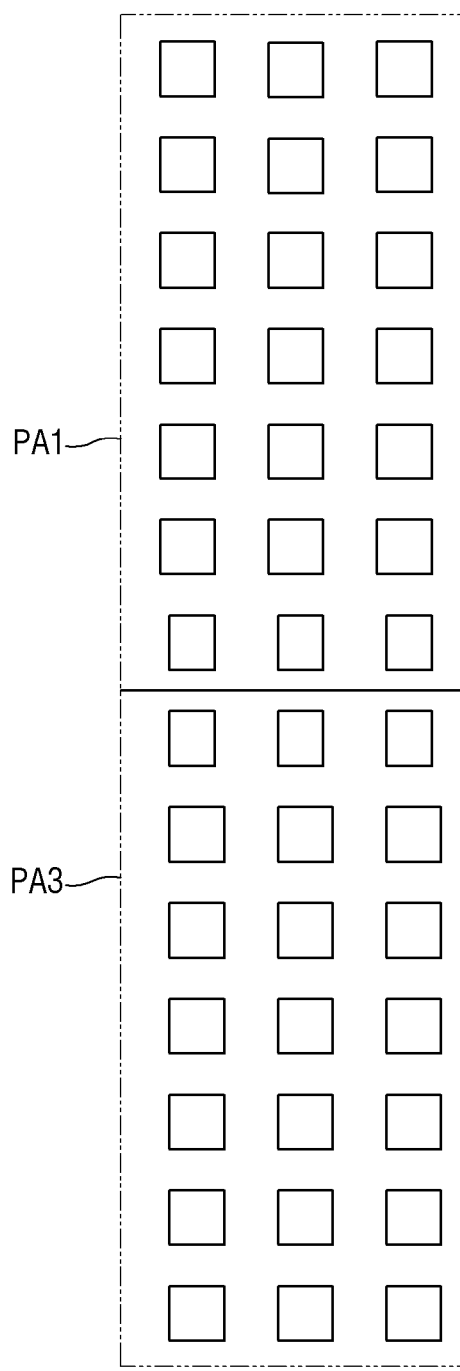
FIG. 19 is a schematic plan view illustrating a case where each pixel of a tiled display device according to an embodiment emits white light.

FIG. 18 is a schematic plan view illustrating a case where each pixel of a tiled display device according to a comparative example emits white light. FIG. 19 is a schematic plan view illustrating a case where each pixel of a tiled display device according to an embodiment emits white light.

Referring to FIGS. 18 and 19, in each of the tiled display devices according to the comparative example and the embodiment, a third display device PA3 is moved in the first direction (X-axis direction) compared with a first display device PA1 and thus misaligned with the first display device PA1 in the second direction (Y-axis direction). In other words, the pixels of the first display device PA1 and the pixels of the third display device PA3 are not aligned with each other along the Y-axis direction. In the comparative example, each second pixel PX2 disposed in a boundary area BA is not divided into a plurality of sub pixels. In the embodiment, an emission area when white light is emitted in the structure of FIG. 11 described above is shown.

As illustrated in FIG. 18, pixels PX of each of the first display device PA1 and the third display device PA3 may be seen as being bent at the boundary between the first display device PA1 and the third display device PA3. On the other hand, referring to FIG. 19, partial pixels PSP of each second pixel PX2 in the boundary area BA may compensate for the bending of the emission area, thus reducing the degree to which the bending of the emission area is seen.

As described above, in the tiled display device according to the embodiment, second pixels disposed in a boundary area where a plurality of display devices are adjacent are each divided into a plurality of partial pixels and emit light differently according to whether display devices are aligned. Therefore, the problem of the boundary area being seen can be improved, thus making it possible to implement a tiled display device with superior seamlessness.

In a tiled display device according to embodiments, in a boundary area where a plurality of display devices are adjacent, sub pixels of each pixel are each divided into a plurality of partial pixels and emit light differently according to whether display devices are aligned. Therefore, the problem of the boundary area being seen can be improved, thus making it possible to implement a tiled display device with superior seamlessness.

In concluding the detailed description, those skilled in the art will appreciate that many variations and modifications can be made to the described embodiments without substantially departing from the principles of the present disclosure. Therefore, the embodiments of the present disclosure are used in a generic and descriptive sense only and not for purposes of limitation. The scope of the present disclosure may be defined by the following claims, and equivalents thereof.

What is claimed is:

1. A tiled display device comprising:
   a plurality of display devices adjacent to each other, each of the display devices comprising a plurality of first pixels and a plurality of second pixels; and
   a boundary area in which at least one side of each of the display devices is adjacent to a side of another display device and a main area other than the boundary area,
   wherein the first pixels are in the main area, the second pixels are in the boundary area, each of the first pixels and the second pixels comprises a plurality of sub pixels, and each of the sub pixels of the second pixels comprises a plurality of partial pixels, the plurality of partial pixels of the sub pixel of the second pixel being adjacent to each other in a short-axis direction of the sub pixel or a long-axis direction of the sub pixel, and
   wherein the plurality of partial pixels is spaced apart from each other.

2. The tiled display device of claim 1, wherein the sub pixels in each of the first pixels and the second pixels comprise a first sub pixel, a second sub pixel, and a third sub pixel that emit light of different colors and are adjacent to each other.

3. A tiled display device comprising:
   a plurality of display devices adjacent to each other, each of the display devices comprising a plurality of first pixels and a plurality of second pixels; and
   a boundary area in which at least one side of each of the display devices is adjacent to a side of another display device and a main area other than the boundary area,
   wherein the first pixels are in the main area, the second pixels are in the boundary area, each of the first pixels and the second pixels comprises a plurality of sub pixels, and each of the sub pixels of the second pixels comprises a plurality of partial pixels,
   wherein the sub pixels in each of the first pixels and the second pixels comprise a first sub pixel, a second sub pixel, and a third sub pixel that emit light of different colors and are adjacent to each other,
   wherein each of the first sub pixel, the second sub pixel, and the third sub pixel of the second pixels comprises the partial pixels that emit light of a same color and are adjacent to each other, and
   wherein the partial pixels comprise a first partial pixel and a second partial pixel adjacent in a short-axis direction of the first sub pixel and further comprise a third partial pixel located at a side of the first partial pixel in a long-axis direction of the first sub pixel and a fourth partial pixel located at an other side of the first partial pixel in the long-axis direction of the first sub pixel.

4. The tiled display device of claim 3, wherein a length of each long side of each of the first partial pixel and the second partial pixel is equal to a length of each long side of each sub pixel of each first pixel.

5. The tiled display device of claim 3, wherein a distance from a first side of the first partial pixel to a second side of the second partial pixel in the short-axis direction of the first sub pixel is equal to a length of each short side of each sub pixel of each first pixel.

6. The tiled display device of claim 3, wherein the third partial pixel and the fourth partial pixel are spaced from each other with the first partial pixel and the second partial pixel interposed therebetween.

7. The tiled display device of claim 3, wherein a direction in which long sides of each of the third partial pixel and the fourth partial pixel extend is parallel to a direction in which short sides of the first partial pixel extend.

8. The tiled display device of claim 3, wherein lengths of respective long sides of the third partial pixel and the fourth partial pixel are equal to each other and are equal to a length of each short side of each sub pixel of each first pixel.

9. The tiled display device of claim 3, wherein a length of each long side of each of the third partial pixel and the fourth partial pixel is equal to a distance from a first side of the first partial pixel to a second side of the second partial pixel in the short-axis direction of the first sub pixel.

10. The tiled display device of claim 3, wherein the first partial pixel and the second partial pixel have a same size, and the third partial pixel and the fourth partial pixel have a same size.

11. The tiled display device of claim 10, wherein a size of each of the first partial pixel and the second partial pixel is larger than a size of each of the third partial pixel and the fourth partial pixel.

12. A tiled display device comprising a first display device and a second display device adjacent each other in a first direction, wherein each of the first display device and the second display device comprises:
   a first pixel in a main area; and
   a second pixel in a boundary area located at an edge of the main area and comprising a plurality of sub pixels, each comprising a plurality of partial pixels,
   wherein at least one of the partial pixels of the first display device does not emit light, and at least one of the partial pixels of the second display device does not emit light, and
   wherein the first direction is a short-axis direction of a sub pixel from among the plurality of sub pixels.

13. The tiled display device of claim 12, wherein each of the sub pixels comprises a first partial pixel and a second partial pixel adjacent in the short-axis direction of the sub pixel, a third partial pixel located at a side of the first partial pixel in a long-axis direction of the first partial pixel, and a fourth partial pixel located at an other side of the first partial pixel in the long-axis direction of the first partial pixel.

14. The tiled display device of claim 13, wherein a side of a first sub pixel of the first display device and a side of a first sub pixel of the second display device are aligned with each other.

15. The tiled display device of claim 14, wherein the third partial pixel and the fourth partial pixel of each sub pixel of the second pixel of the first display device do not emit light, and the third partial pixel and the fourth partial pixel of each sub pixel of the second pixel of the second display device do not emit light.

16. The tiled display device of claim 15, wherein the first pixel of the first display device emits light, and the first pixel of the second display device emits light.

17. The tiled display device of claim 13, wherein a side of a first sub pixel of the first display device and a side of a first sub pixel of the second display device are not aligned with each other.

18. The tiled display device of claim 17, wherein each of the sub pixels comprises the first sub pixel, a second sub pixel, and a third sub pixel arranged along the first direction.

19. The tiled display device of claim 18, wherein, in the second pixel of the first display device, the first partial pixel, the third partial pixel, and the fourth partial pixel of the first sub pixel do not emit light, and the third partial pixel and the fourth partial pixel of each of the second sub pixel and the third sub pixel do not emit light, and, in the second pixel of the second display device, the third partial pixel and the fourth partial pixel of each of the first sub pixel and the second sub pixel do not emit light, and the second partial pixel, the third partial pixel and the fourth partial pixel of the third sub pixel do not emit light.

20. The tiled display device of claim 18, wherein the third partial pixel of each sub pixel of the second pixel of the first display device does not emit light, and the fourth partial pixel of each sub pixel of the second pixel does not emit light.

\* \* \* \* \*